(12) United States Patent
Shigematsu

(10) Patent No.: US 6,333,781 B1
(45) Date of Patent: *Dec. 25, 2001

(54) PROJECTION OPTICAL SYSTEM AND EXPOSURE APPARATUS AND METHOD

(75) Inventor: Koji Shigematsu, Kawasaki (JP)

(73) Assignee: Nikon Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/116,388

(22) Filed: Jul. 16, 1998

(30) Foreign Application Priority Data

Jul. 24, 1997 (JP) .................................................. 9-198180
Dec. 5, 1997 (JP) .................................................. 9-335161

(51) Int. Cl.[7] ........................... G03B 27/72; G03B 27/54; G03B 27/42; G02B 9/60
(52) U.S. Cl. .............................. 355/71; 355/67; 355/53; 359/766
(58) Field of Search .................... 355/71, 67, 53, 355/77; 359/650, 649, 766, 758, 686

(56) References Cited

U.S. PATENT DOCUMENTS

| 3,504,961 | 4/1970 | Hoogland et al. | 350/214 |
|---|---|---|---|
| 3,897,138 | 7/1975 | Kano | 350/183 |
| 3,909,115 | 9/1975 | Kano | 350/214 |
| 4,619,508 | 10/1986 | Shibuya et al. | 353/122 |
| 4,666,273 | 5/1987 | Shimizu | 353/101 |

(List continued on next page.)

FOREIGN PATENT DOCUMENTS

| 712019A | 5/1996 | (EP) | G02B/13/24 |
|---|---|---|---|
| 717299A | 6/1996 | (EP) | G02B/13/24 |
| 721150A | 7/1996 | (EP) | G03F/7/20 |
| 733605A | 9/1996 | (EP) | C04B/35/45 |
| A2-0 732 605 | 9/1996 | (EP) . | |

(List continued on next page.)

OTHER PUBLICATIONS

"Quality of Microlithographic Projection Lenses" by J. Braat, SPIE Proceedings, vol. 811, Optical Microlithographic Technology for Integrated Circuit Fabrication and Inspection, H. Stover, S. Wittekoek, Eds., pp. 22–30 (Apr. 1987).

Primary Examiner—Russell Adams
Assistant Examiner—Peter B. Kim

(57) ABSTRACT

An exposure apparatus and method and a high-performance projection optical system incorporated into the exposure apparatus. The projection optical system can be made doubly telecentric, while ensuring a large numerical aperture and large exposure field. The numerical aperture can vary via a variable aperture stop, and the aberrations are well-corrected over the range of numerical apertures. The projection optical system comprises, objectwise to imagewise, a first lens group G1 having positive refractive power and a subgroup G1p, second lens group G2 having negative refractive power and a subgroup G2n, a third lens group G3 having positive refracting power and at least one negative lens, a fourth lens group G4 having negative refracting power and a subgroup G4n, and fifth lens group G5 having positive refracting power and a subgroup G5p. Fifth lens group G5 includes a variable aperture stop AS which determines the image-side numerical aperture. The projection optical system and exposure apparatus and method preferably satisfy at least one of a number of preferred design conditions.

56 Claims, 12 Drawing Sheets

U.S. PATENT DOCUMENTS

| | | | |
|---|---|---|---|
| 4,770,477 | 9/1988 | Shafer | 350/1.2 |
| 4,772,107 | 9/1988 | Friedman | 350/463 |
| 4,811,055 | 3/1989 | Hirose | 355/53 |
| 4,851,978 | 7/1989 | Ichihara | 362/268 |
| 4,891,663 | 1/1990 | Hirose | 355/53 |
| 4,931,830 | 6/1990 | Suwa et al. | 355/71 |
| 4,939,630 | 7/1990 | Kikuchi et al. | 362/268 |
| 4,977,663 | 12/1990 | Hurd . | |
| 5,105,075 | 4/1992 | Ohta | 250/201.2 |
| 5,157,550 * | 10/1992 | Tsuchida et al. | 359/686 |
| 5,170,207 | 12/1992 | Tezuka et al. | 355/53 |
| 5,172,275 | 12/1992 | DeJager | 349/755 |
| 5,237,367 | 8/1993 | Kudo | 355/67 |
| 5,260,832 | 11/1993 | Togino et al. | 359/679 |
| 5,307,207 | 4/1994 | Ichihara | 359/622 |
| 5,392,094 | 2/1995 | Kudo | 355/67 |
| 5,473,410 | 12/1995 | Nishi | 355/53 |
| 5,636,000 | 6/1997 | Ushida et al. | 355/30 |
| 5,742,436 | 4/1998 | Furter . | |
| 5,781,728 | 7/1998 | Matsuzawa et al. | 355/53 |
| 5,805,344 | 9/1998 | Sasaya et al. . | |
| 5,808,814 | 9/1998 | Kudo . | |
| 5,831,770 | 11/1998 | Matsuzawa et al. . | |
| 5,831,776 | 11/1998 | Sasaya et al. . | |
| 5,835,285 | 11/1998 | Matsuzawa et al. . | |
| 5,852,490 | 12/1998 | Matsuyama . | |
| 5,856,884 | 1/1999 | Mercado . | |
| 5,903,400 | 5/1999 | Endo . | |
| 5,920,379 * | 7/1999 | Matsuyama | 355/67 |
| 5,930,049 * | 7/1999 | Suenaga et al. | 359/650 |
| 5,943,172 | 8/1999 | Sasaya et al. . | |
| 5,956,182 | 9/1999 | Takahashi . | |
| 5,990,926 * | 11/1999 | Mercado | 347/258 |
| 6,008,884 | 12/1999 | Yamaguchi et al. . | |
| 6,084,723 | 7/2000 | Matsuzawa et al. . | |
| 6,088,171 | 7/2000 | Kudo . | |
| 6,104,544 | 8/2000 | Matsuzawa et al. . | |

FOREIGN PATENT DOCUMENTS

| | | | |
|---|---|---|---|
| 770895A | 5/1997 | (EP) | G02B/13/14 |
| 803755A | 10/1997 | (EP) | G02B/9/62 |
| 5512902 | 1/1980 | (JP) | G02B/13/26 |
| 63118115 | 5/1988 | (JP) | G02B/13/24 |
| 5173065 | 7/1993 | (JP) | G02B/13/14 |
| 6313845 | 11/1994 | (JP) | G02B/13/24 |
| 7140384 | 6/1995 | (JP) | G02B/13/24 |
| 7140385 | 6/1995 | (JP) | G02B/13/24 |

* cited by examiner

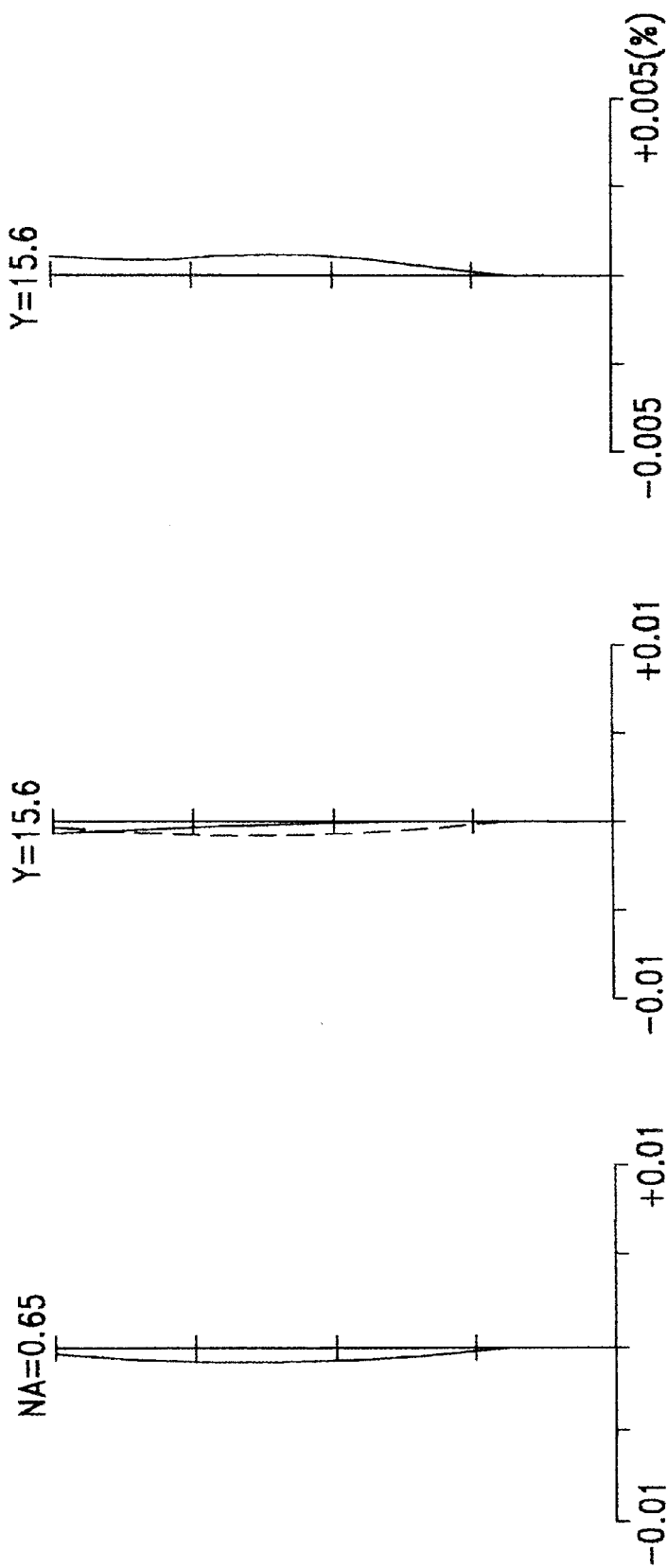

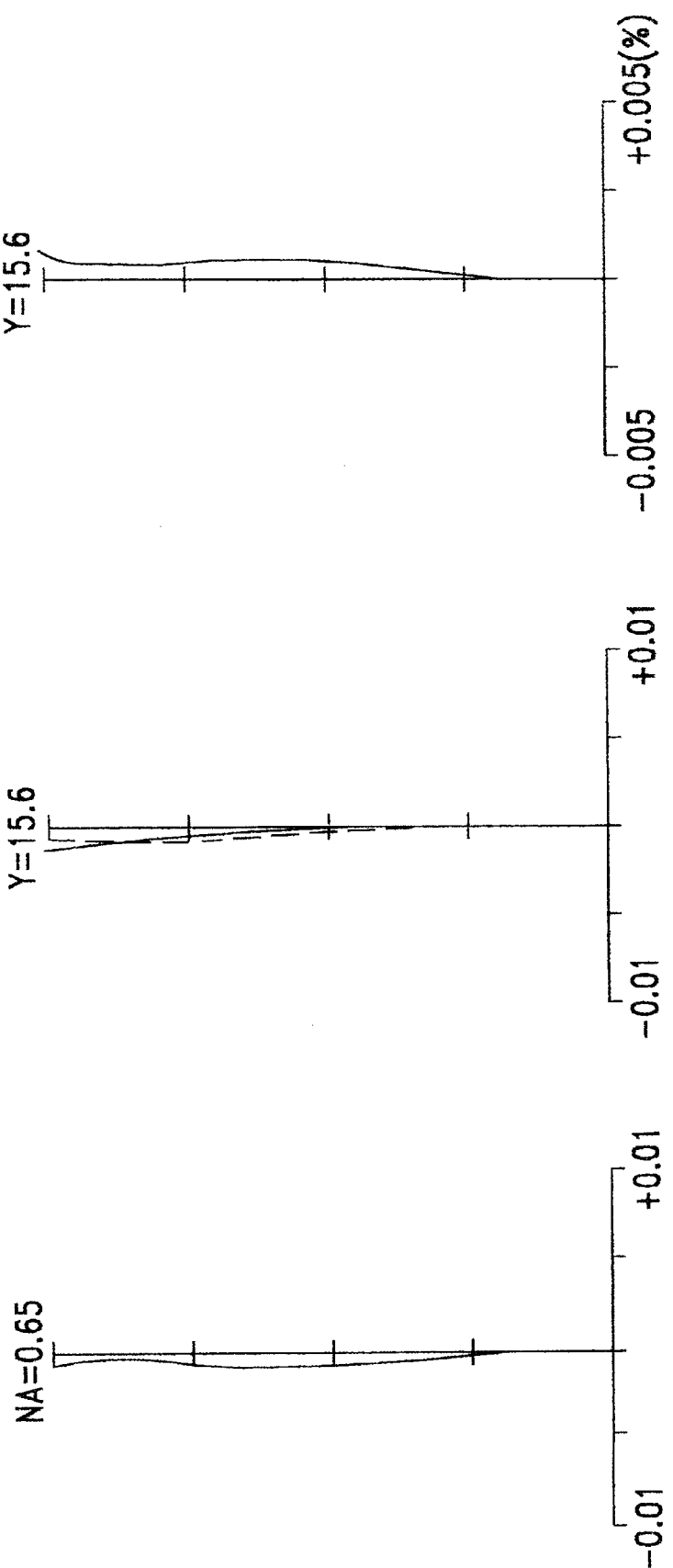

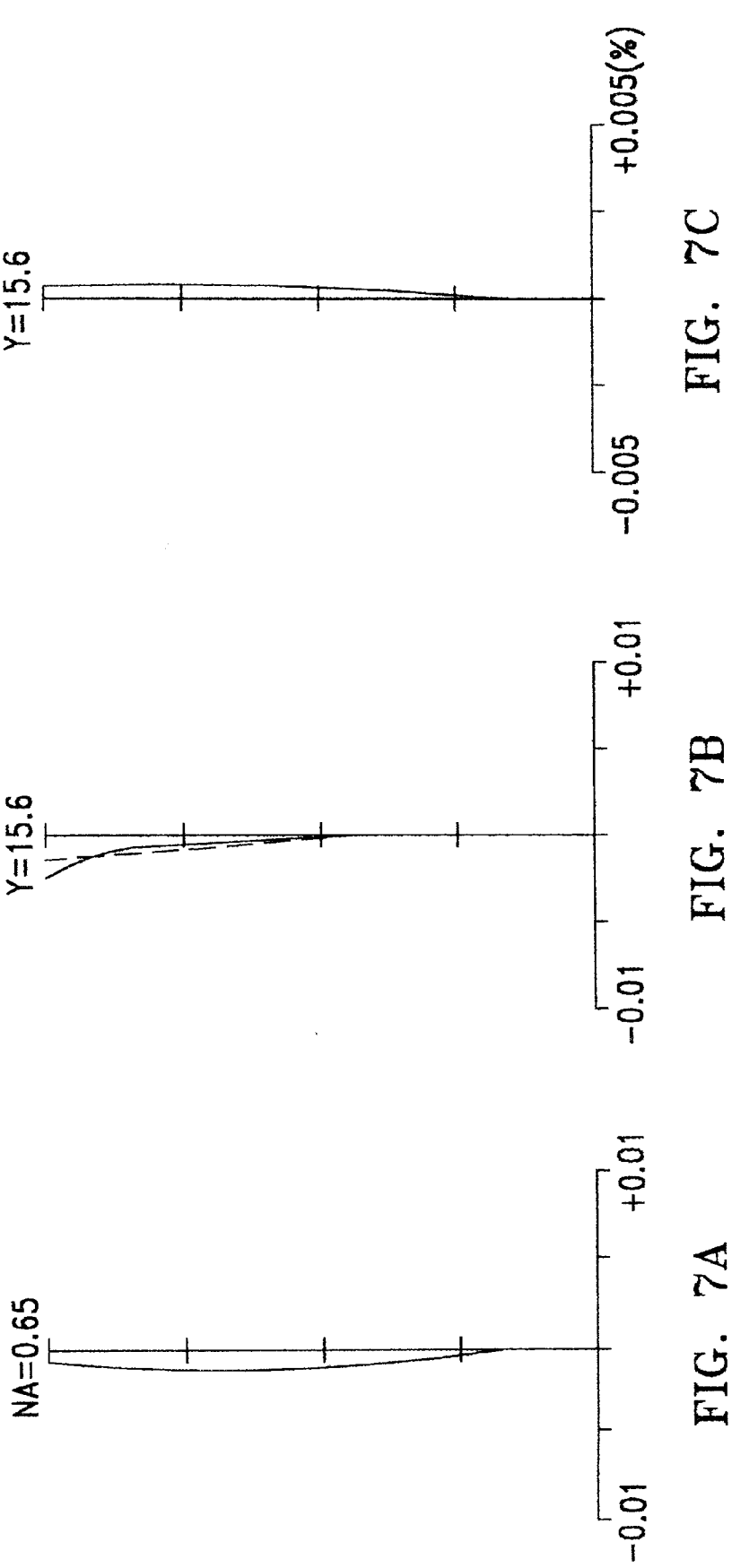

PROJECTION OPTICAL SYSTEM AND EXPOSURE APPARATUS AND METHOD

FIELD OF THE INVENTION

The present invention pertains to projection optical systems and exposure apparatus incorporating same and methods pertaining to same, and in particular to such systems, apparatus and methods for manufacturing devices and elements, such as integrated circuits, crystal displays, image pickup devices, MR (magneto resistive) head, and the like.

BACKGROUND OF THE INVENTION

Batch exposure-type (e.g., stepper and the like) projection exposure apparatus are used to manufacture semiconductor devices and the like. Such apparatus may be of the scanning exposure-type (step-and-scan type), where each exposure field is scanned during exposure, or step-and-repeat type, where each exposure field is exposed in a single static exposure. A projection exposure apparatus as used in semiconductor manufacturing, for example, transfers the image of a pattern on a reticle, which is used as a mask, through a projection optical system and onto a wafer (or glass plate or the like) coated with a light-sensitive medium, such as photoresist. With the increasing miniaturization of the patterns of semiconductor integrated circuits and the like, there have been increasing demands to improve the resolving power of projection optical systems incorporated into semiconductor exposure apparatuses. The resolving power of the projection optical system can be improved by either shortening the exposure wavelength or increasing the image-side numerical aperture (NA).

With regard to shortening the exposure wavelength, the wavelength of the light sources of the illumination systems used in exposure apparatuses have progressively evolved from the longer UV wavelengths, such as the mercury lamp g-line (436 nm wavelength) and the i-line (365 nm wavelength), down to the shorter (i.e., "deep") UV wavelengths associated with excimer lasers, such as the KrF laser line (248 nm wavelength) and the ArF laser line (193 nm wavelength). Therefore, in accordance with this trend projection optical systems capable of transmitting exposure light at the deep UV wavelengths are being developed.

In addition to the increasing demands on resolution, there have also been increasing demands to decrease the amount of image distortion of the projection optical systems. Image distortion as a whole includes several contributing factors, such as distortion inherent in the projection optical system itself, distortion due to warping of the wafer upon which the circuit pattern is printed, and distortion due to warping of the reticle on which a circuit pattern and the like is drawn. To reduce the effect of image distortion due to warping of the wafer, imagewise telecentric projection optical systems have been developed. In such systems, the exit pupil is located at infinity objectwise of the projection optical system.

Also, objectwise telecentric optical systems have been employed, wherein the entrance pupil of the projection optical system is located at infinity objectwise of the projection optical system. This reduces image distortion due to warping of the reticle. Such projection optical systems are disclosed in Japanese Patent Application Kokai No. Sho 63-118115, Japanese Patent Application Kokai No. Hei 4-157412 and Japanese Patent Application Kokai No. Hei 5-173065.

In addition, there have been demands for being able to select and adjust the NA to be more ideally suited for printing particular types of patterns on the reticle, as well as to account for other manufacturing conditions. In particular, there have been demands for the projection optical systems in exposure apparatuses to have a variable aperture stop whose size can be varied to change the NA of the projection optical system.

As described above, it is desirable to make the projection optical system both imagewise and objectwise telecentric to reduce the effects of both wafer warping and reticle warping on image distortion. Therefore, as disclosed in the above-mentioned patent applications, projection optical systems have been developed that are telecentric both in the object space and the image space, i.e., so-called "doubly telecentric" projection optical systems. Nevertheless, in prior art doubly telecentric projection optical systems, it has proven difficult to make the NA sufficiently large while simultaneously reducing the various aberrations over a large field. In particular, in the prior art systems, distortion correction is inadequate.

Moreover, in the prior art projection optical systems, if a variable aperture stop is provided to vary the NA of the projection optical system, vignetting occurs at the peripheral part of the exposure field when the aperture stop size is changed, due to spherical aberration at the pupil. Consequently, uniformity of illumination suffers in the peripheral part of the exposure field. In addition, telecentricity degrades when the numerical aperture is varied, and there is also the problem that the exposure field size cannot be increased.

SUMMARY OF THE INVENTION

The present invention pertains to a projection optical system and exposure apparatus incorporating same and methods pertaining to same, and in particular to such systems, apparatus and methods for manufacturing semiconductor devices and elements, such as integrated circuits, liquid crystal displays, and the like.

The present invention has several objectives. One objective of the present invention is to provide a high-performance projection optical system that can be made doubly telecentric, while at the same time ensuring a large NA and a large exposure field size, and that is well-corrected for the various aberrations, and in particular distortion. Another objective is to minimize the effect of vignetting as the numerical aperture is changed by varying a variable aperture stop, and to provide a projection optical system that can be made doubly telecentric. A further objective of the present invention is an exposure apparatus provided with such a projection optical system, and a device manufacturing method that uses this exposure apparatus.

One aspect of the invention is a dioptric projection optical system that forms an image of a pattern of an object onto a workpiece (i.e., a second object) over an exposure field. The system comprises, along an optical axis, an aperture stop, disposed at a location along the optical axis, for determining an image-side numerical aperture NA, a front lens group comprising a plurality of lenses and positioned between the object and the aperture stop, and a rear lens group comprising a plurality of lens elements positioned between the aperture stop and the workpiece. The system satisfies the design condition:

$$0.005 < d_Q/\{L \times (1-NA)\} < 0.2 \tag{1}$$

wherein L is the axial distance from the object to the workpiece, $d_Q$ is the axial distance from a position Q to the aperture stop location. The position Q is defined as the position where the imagewise to objectwise traveling paraxial ray, which is parallel to the optical axis, intersects the optical axis.

In another aspect of the present invention, the above-described projection optical system includes a first lens group having a lens subgroup G1p surrounded imagewise and objectwise by at least one negative lens, a second lens group having a lens subgroup G2n surrounded imagewise and objectwise by at least one positive lens, a fourth lens group having a lens subgroup G4n comprising at least three negative lenses, and a fifth lens group having a lens subgroup G5p comprising at least four positive lenses. The projection lens system also preferably satisfies at least one of the following design conditions:

$$0.05 < f_1/L < 0.4 \quad (2)$$

$$0.025 < -f_2/L < 0.15 \quad (3)$$

$$0.08 < f_3/L < 0.35 \quad (4)$$

$$0.04 < -f_4/L < 0.16 \quad (5)$$

$$0.06 < f_5/L < 0.35 \quad (6)$$

wherein $f_1$ is the focal length of subgroup G1p, $f_2$ is the focal length of subgroup G2n, $f_3$ is the focal length of third lens group G3, $f_4$ is the focal length of subgroup G4n, and $f_5$ is the focal length of subgroup G5p.

In a further aspect of the invention, the above-described a projection optical system preferably satisfies the design condition $$1.2 < H1max/H1min < 1.8 \quad (7)$$

wherein H1max is the maximum value and H1min is the minimum value of the distances between the optical axis and the points where an incident ray parallel to the optical axis and incident from the workpiece side from the outermost perimeter of the exposure field intersects said respective surfaces of said negative lenses that surround subgroup G1p.

In another aspect of the invention related to that described above, the above-described projection optical system preferably satisfies the design condition $$1.15 < H2max/H2min < 1.75 \quad (8)$$

wherein H2max is the maximum value and H2min is the minimum value of the distances between the optical axis and the points where an incident ray parallel to the optical axis from said workpiece side from the outermost perimeter of the exposure field intersects each of said surfaces of said positive lenses that surround subgroup G2n.

In another aspect of the invention, the above-described projection optical system preferably includes at least two negative lenses in the fifth lens group. At least one of said two negative lenses in the fifth lens group has an objectwise concave surface, and the system satisfies the condition:

$$0.15 < -Rn1/L < 0.3 \quad (9)$$

wherein Rn1 is the radius of curvature of the aforementioned concave surface.

In another aspect of the invention related to that described above, at least one of said two negative lenses in the fifth lens group having an imagewise concave surface, and the system satisfies the condition:

$$0.06 < Rn2/L < 0.1 \quad (10)$$

wherein Rn2 is the radius of curvature of the imagewise concave surface.

Another aspect of the present invention is an exposure apparatus. The apparatus comprises, along an axis, an illumination optical system, a projection optical system, as described above, and a stage system that positions a mask as the object between the illumination optical system and the projection optical system, and the substrate as a second object (i.e., workpiece) adjacent the projection optical system opposite the mask.

A further aspect of the invention is a device manufacturing method. The method comprises the steps of first, coating a photosensitive material onto a substrate, then projecting onto the substrate the image of a pattern of a mask through a projection optical system, as described above, then developing the photosensitive material on the substrate, and forming a photoresist pattern, and then forming the pattern in the substrate using the photoresist pattern as a mask.

BRIEF DESCRIPTION OF THE DRAWINGS

FIGS. 3a–3d are aberration plots for spherical aberration, astigmatism, distortion, and coma, respectively, for the projection optical system of FIG. 2;

FIGS. 5a–5d are aberration plots for spherical aberration, astigmatism, distortion, and coma, respectively, for the projection optical system of FIG. 4;

FIGS. 7a–7d are aberration plots for spherical aberration, astigmatism, distortion, and coma, respectively, for the projection optical system of FIG. 6;

DETAILED DESCRIPTION OF THE INVENTION

The present invention pertains to projection optical systems and exposure apparatus incorporating same and methods pertaining to same, and in particular such systems, apparatus and methods for manufacturing semiconductor devices and elements, such as integrated circuits, liquid crystal displays, and the like. An objective of the present invention is to provide a high-performance projection optical system that can be made doubly telecentric, while at the same time ensuring a large NA and a large exposure field size, and that is well-corrected for the various aberrations, and in particular distortion.

Figure 1:
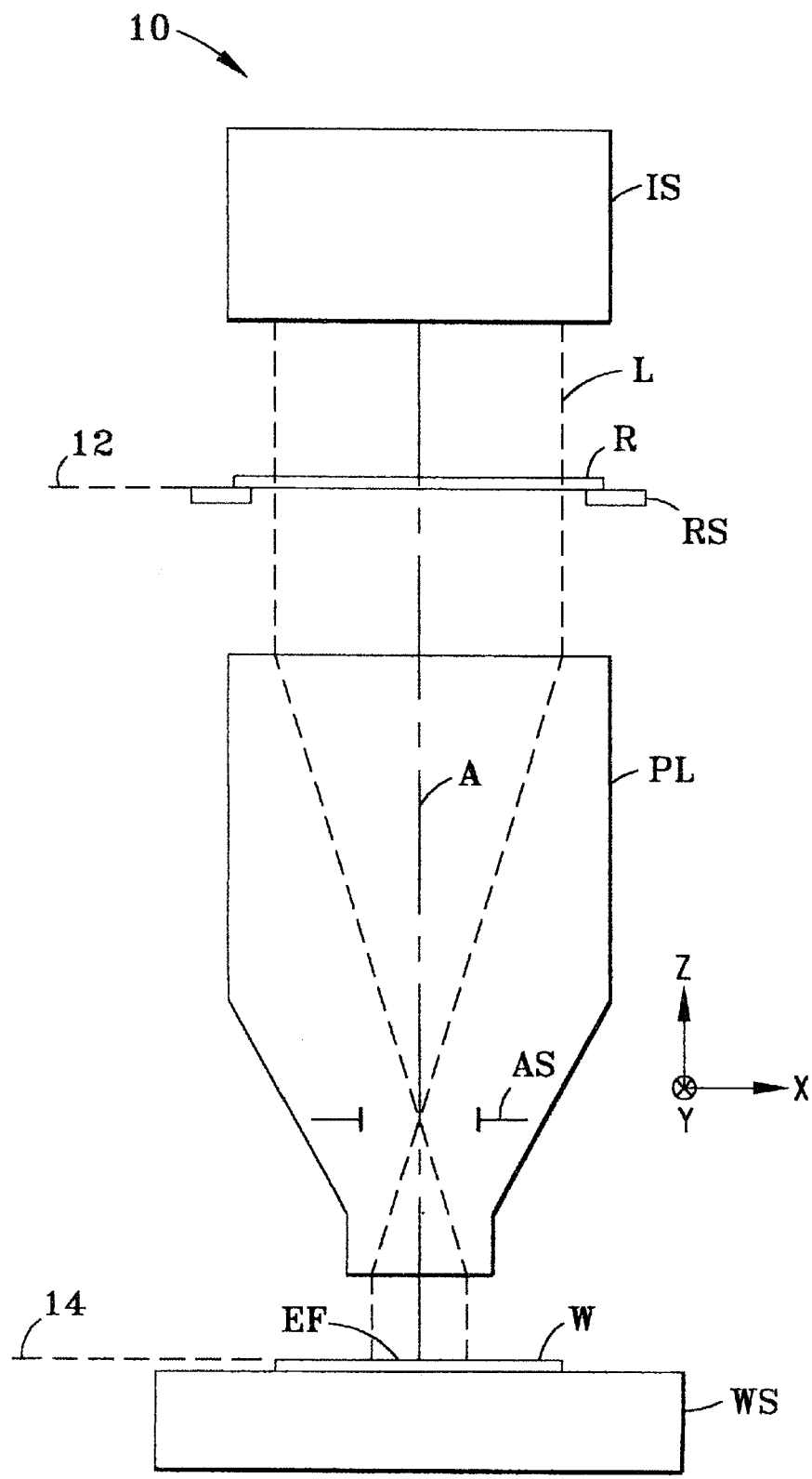
FIG. 1 is a schematic optical diagram of the projection exposure apparatus of the present invention.

With reference to FIG. 1, exposure apparatus 10 includes a projection optical system PL, having an object plane 12, an image plane 14, and an aperture stop AS disposed along an optical axis A. An object, such as a reticle R, is disposed at or near object plane 12. Object (reticle) R is typically a transparent substrate, such as fused silica, and includes small (i.e., micron and sub-micron) features. Object (reticle) R is held in place and moved into a position at or near object plane 12 by object (reticle) stage RS. Disposed adjacent object (reticle) R along optical axis A opposite projection lens PL is an illumination optical system IS. Illumination optical system IS is designed to uniformly illuminate reticle R and also to form a source image at aperture stop AS in the absence of pattern of object (reticle) R (i.e., Kohler illumination). A workpiece W, such as a silicon wafer coated with photoresist, is disposed along optical axis A at or near image plane 14. Workpiece (wafer) W is held in place and moved into position by a workpiece (wafer) stage WS.

Generally speaking, to pattern workpiece W with exposure apparatus 10, object (reticle) R and workpiece (wafer) W are moved into proper alignment using object (reticle) stage RS and workpiece (wafer) stage WS, respectively. Object (reticle) R is then illuminated with illumination optical system IS for a certain amount of time. An image of the features on object (reticle) R is projected onto workpiece (wafer) W over an exposure field EF, via projection lens PL. Workpiece (wafer) stage WS then moves an incremental amount and another exposure is made on workpiece (wafer) W. The process is repeated until a desired area of workpiece (wafer) W is exposed. Exposure apparatus 10 and methods associated therewith are discussed in further detail below.

The Projection Optical System

Figure 2:
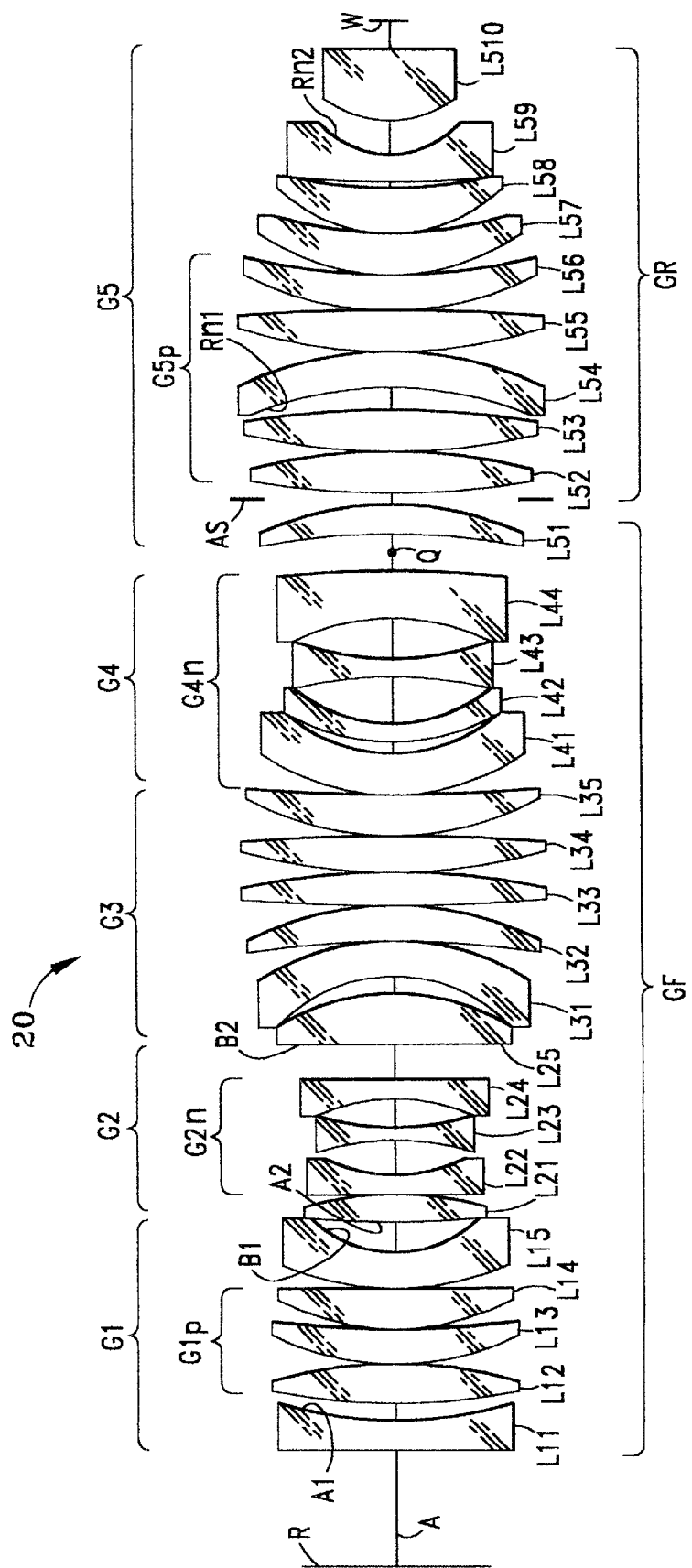
FIG. 2 is an optical diagram of the projection optical system of Working Example 1 of the present invention.
Figure 3D:
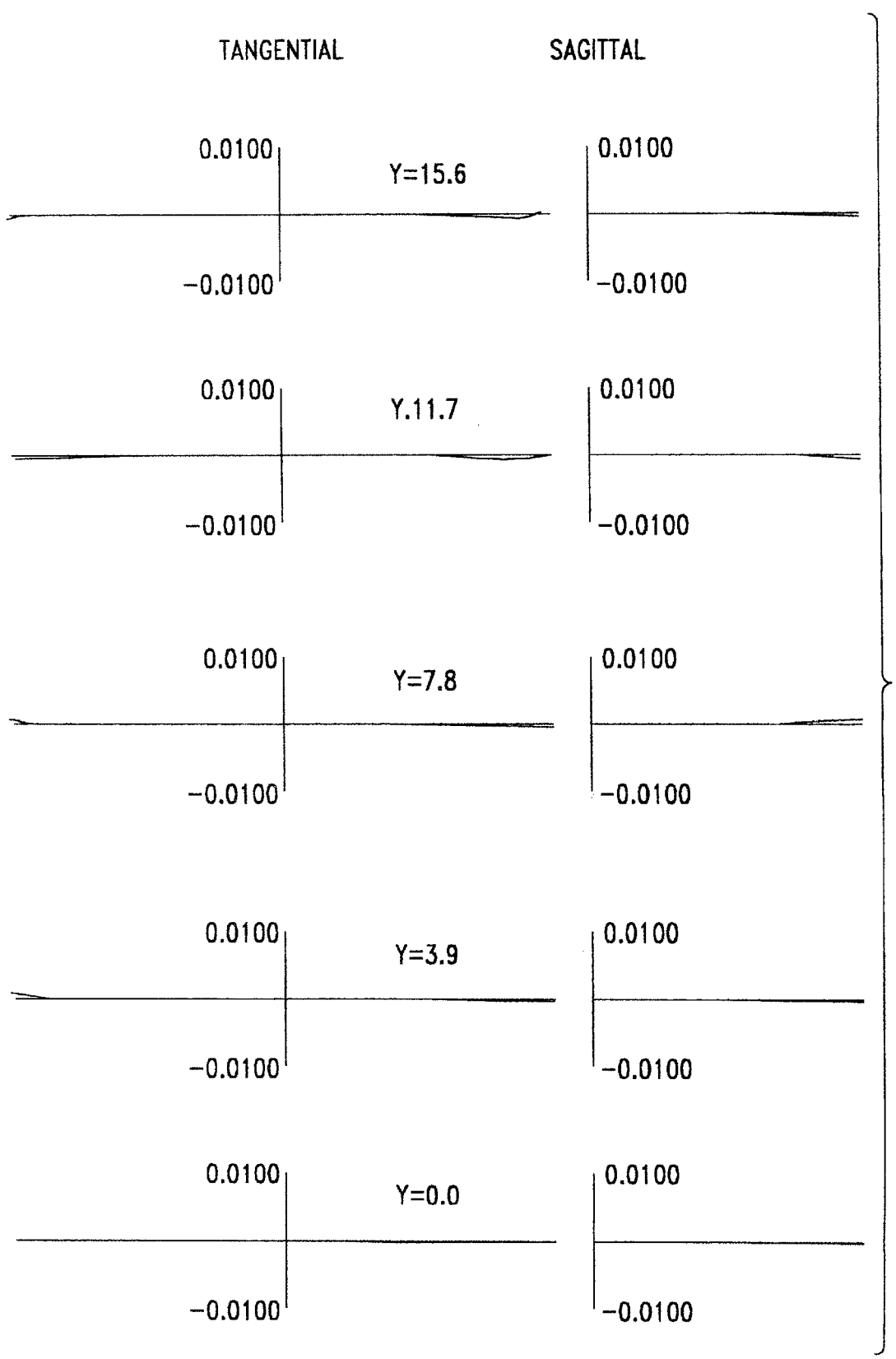

With reference now to FIG. 2, a first preferred embodiment of a projection optical system according to the present invention is a dioptric projection optical system 20 that forms an image of an object R having a pattern thereon (such as a reticle, as discussed above) onto a second object (i.e., workpiece) W (e.g., a wafer, as discussed above) disposed along an optical axis A. System 20 includes an aperture stop AS for determining the numerical aperture, a front lens group GF comprising a plurality of lens elements and positioned between the object R and aperture stop AS, and rear lens group GR comprising a plurality of lens elements and positioned between aperture stop AS and workpiece W.

Figure 9:
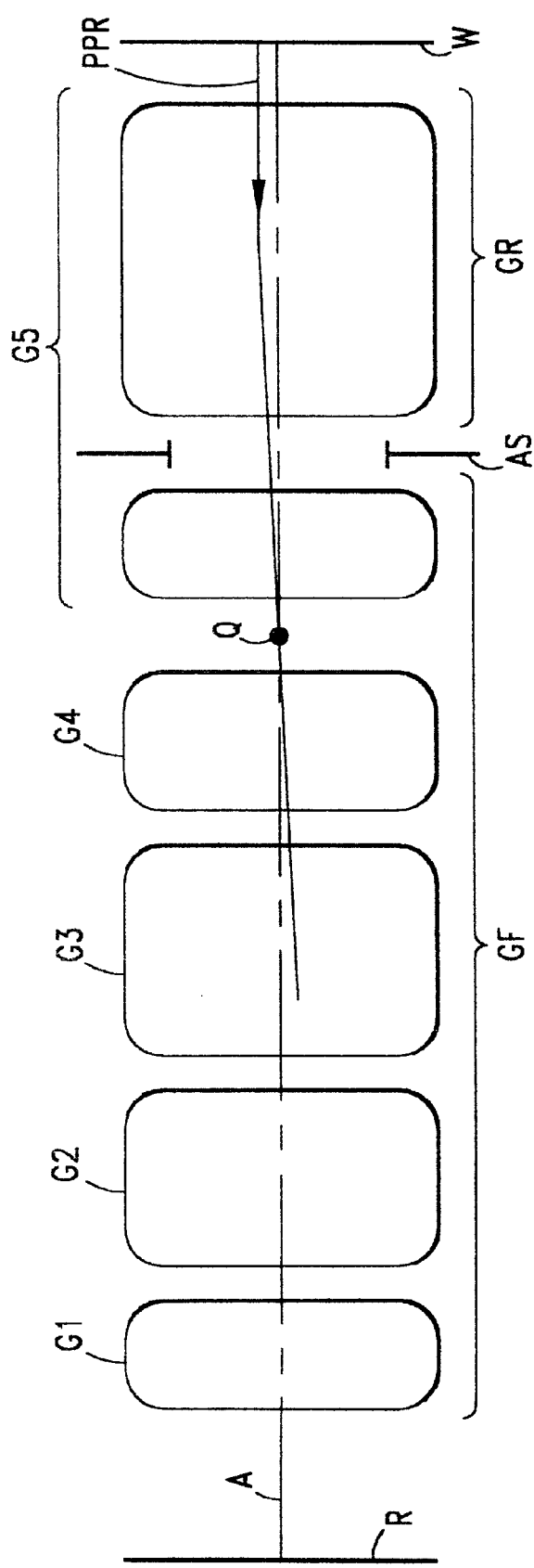
FIG. 9 is a schematic optical diagram of the projection exposure apparatus of the present invention illustrating the various lens groups in block form and paraxial principal ray PPR relative to the optical axis.

System 20 is configured so as to satisfy at least one of a number of design conditions. The first design condition (1) is expressed as $$0.005 < d_Q/\{L \times (1-NA)\} < 0.2 \quad (1)$$

wherein L is the axial distance from first object R to second workpiece W, $d_Q$ is the axial distance from the paraxial pupil position Q (i.e., the location where imagewise to objectwise traveling paraxial principal rays PPR, FIG. 9, which is parallel to the optical axis A, intersect optical axis A) to the actual aperture stop position, and NA is the image-space numerical aperture.

Condition (1) stipulates an appropriate position for aperture stop AS, located with a fifth lens group G5 (as discussed in greater detail below). When condition (1) is satisfied, system 20 can easily be made doubly telecentric. Also, the effect of vignetting is made uniform over the exposure field and vignetting does not particularly increase even if the NA is changed by adjusting variable aperture stop AS.

The advantages of satisfying condition (1) can be understood by considering the image formation properties of fifth lens group G5 when a parallel light beam (not shown) impinges imagewise to objectwise upon fifth lens group G5 of system 20 of FIG. 2. This parallel light beam forms an image at a certain position along optical axis A. However, since fifth lens group G5 has a positive refractive power, a light beam having parallel rays, but which is not parallel to optical axis A, forms an image at a position along the optical axis that is displaced imagewise from the image formation position of the parallel light beam having rays parallel to the optical axis. This property is referred to in the art as field curvature aberration of the pupil.

In an exposure apparatus of the present invention incorporating system 20, it is preferred that the system have a variable NA such that it can be set to a maximum NA, the value required for achieving satisfactory resolution, of about 0.6. Consequently, in a projection optical system such as system 20 in which the NA can be changed by varying aperture stop AS, it is necessary to take into consideration the field curvature of the pupil in determining the location of the aperture stop. Accordingly, if $d_Q/\{L \times (1-NA)\}$ in condition (1) exceeds the upper limit, pupil aberrations increase excessively and it becomes difficult to obtain doubly telecentricity in system 20. However, if $d_Q/\{L \times (1-NA)\}$ in condition (1) falls below the lower limit, pupil aberrations are corrected more than is necessary, resulting in an increase in the length of system 20.

In a preferred embodiment of optical projection system 20 of the present invention, it is desirable to locate variable aperture stop AS imagewise (i.e., toward workpiece W) of position Q. This minimizes the difference in vignetting in over the exposure field when the NA of system 20 is changed by varying the size of aperture stop AS.

With reference to FIGS. 2 and 9, the advantage of this configuration can be understood by considering a parallel light beam (not shown) entering system 20 imagewise to objectwise. The paraxial principal rays PPR, FIG. 9, intersect optical axis A at predetermined position Q, due to refraction by the positive lenses (principally, the rear lens group) located between workpiece W and position Q (i.e., the lenses L51–L510, discussed further below). Since rear lens group GR (i.e., the lenses L52–L510) has positive refractive power, the parallel light beam impinging thereon at a predetermined angle with respect to optical axis A forms an image at a position imagewise from position Q. Accordingly, if aperture stop AS is located imagewise of position Q, the effect of vignetting at the peripheral part of the exposure field due to the field curvature of the pupil can, for practical purposes, be adequately controlled. Also, the various aberrations can be satisfactorily corrected, even if the size of aperture stop AS is varied.

In another preferred embodiment of projection optical system 20 according to the present invention, it is preferable that front lens group GF and rear lens group GR comprise overall, in order from the object R to workpiece W (i.e., objectwise to imagewise) a first lens group G1 having positive refractive power, a second lens group G2 having negative refractive power, a third lens group G3 having positive refractive power, a fourth lens group G4 having negative refractive power (lens groups G1–G4 and lens L51 constituting front lens group GF), and a fifth lenses L52–510 in the lens group G5 having positive refractive power (lens group G5 constituting rear lens group GR).

First lens group G1 contributes principally to the correction of distortion while maintaining telecentricity. Second lens group G2 and fourth lens group G4 contribute principally to correcting the Petzval sum, and to flattening the image plane. In addition, both third lens group G3 and first lens group G1 generate positive distortion, and serves to correct negative distortion generated by lens groups G2, G4 and G5. Furthermore, viewed imagewise to objectwise, third lens group G3 and second lens group G2 comprise a telephoto system having a positive-negative refractive power arrangement. Consequently, the lens group function to prevent the overall lengthening of system 20. In addition, to adequately handle an increased NA, fifth lens group G5 controls the generation of distortion, particularly when the design is such that spherical aberration is very tightly controlled. Fifth lens group G5 also serves to guide the light beam onto workpiece W and form an image of object R thereupon.

First lens group G1 includes a lens subgroup G1p surrounded on either side by a negative lens. Second lens group G2 includes a subgroup G2n surrounded on either side by a positive lens. Fourth lens group G4 includes a subgroup G4n comprising at least three negative lenses. Fifth lens group G5 has a subgroup G5p comprising at least four positive lenses. In a preferred embodiment, system 20 satisfies at least one of the following design conditions:

$$0.05 < f_1/L < 0.4 \quad (2)$$

$$0.025 < -f_2/L < 0.15 \quad (3)$$

$$0.08 < f_3/L < 0.35 \quad (4)$$

$$0.04 < -f_4/L < 0.16 \quad (5)$$

$$0.06 < f_5/L < 0.35 \quad (6)$$

wherein $f_1$ is the focal length of subgroup G1p, $f_2$ is the focal length of subgroup G2n, $f_3$ is the focal length of the third lens group G3, $f_4$ is the focal length of subgroup G4n, and $f_5$ is the focal length of subgroup G5p.

Condition (2) stipulates an appropriate refractive power for subgroup G1p, which is principally responsible for the positive refractive power in first lens group G1. If $f_1/L$ in condition (2) exceeds the upper limit, the positive distortion generated by first lens group G1 no longer completely corrects the negative distortion generated by lens groups G2, G4 and G5. Conversely, if $f_1/L$ in condition (2) falls below the lower limit, high-order positive distortion is generated.

Condition (3) stipulates an appropriate refractive power for subgroup G2n, which is principally responsible for the negative refractive power in second lens group G2. If $-f_2/L$ in condition (3) exceeds the upper limit, correction of the Petzval sum becomes inadequate, which makes it difficult to flatten the image plane (i.e., the exposure field). Conversely, if $-f_2/L$ in condition (3) falls below the lower limit, the amount of negative distortion generated increases and the satisfactory correction of this large negative distortion becomes difficult with just first and third lens groups G1 and G3.

Condition (4) stipulates an appropriate positive refractive power for third lens group G3. If $f_3/L$ in condition (4) exceeds the upper limit, the telephoto ratio of the telephoto system formed by second lens group G2 and third lens group G3 increases, leading to an increase in the length of system 20. Also, the amount of positive distortion generated by third lens group G3 decreases, and the negative distortion generated by the lens groups G2, G4 and G5 can no longer be completely satisfactorily corrected. Conversely, if $f_3/L$ in condition (4) falls below the lower limit, high-order spherical aberration is generated and satisfactory image forming performance can no longer be obtained.

Condition (5) stipulates an appropriate refractive power for subgroup G4n, which is principally responsible for the negative refractive power in fourth lens group G4. If $-f_4/L$ in condition (5) exceeds the upper limit, correction of the Petzval sum becomes inadequate, leading to degradation in the image plane (exposure field) flatness. Conversely, if $-f_4/L$ in conditions (4) and (5) falls below the lower limit, high-order spherical aberration and coma are generated, leading to a degradation in image contrast.

Condition (6) stipulates an appropriate refractive power for subgroup G5p, which is principally responsible for the positive refractive power in fifth lens group G5. If $f_5/L$ in condition (6) exceeds the upper limit, the positive refractive power of fifth lens group G5 weakens excessively, resulting in an increase in the length of system 20. Conversely, if $f_5/L$ in condition (6) falls below the lower limit, high-order spherical aberration is generated, leading to a degradation in image contrast.

Figure 4:
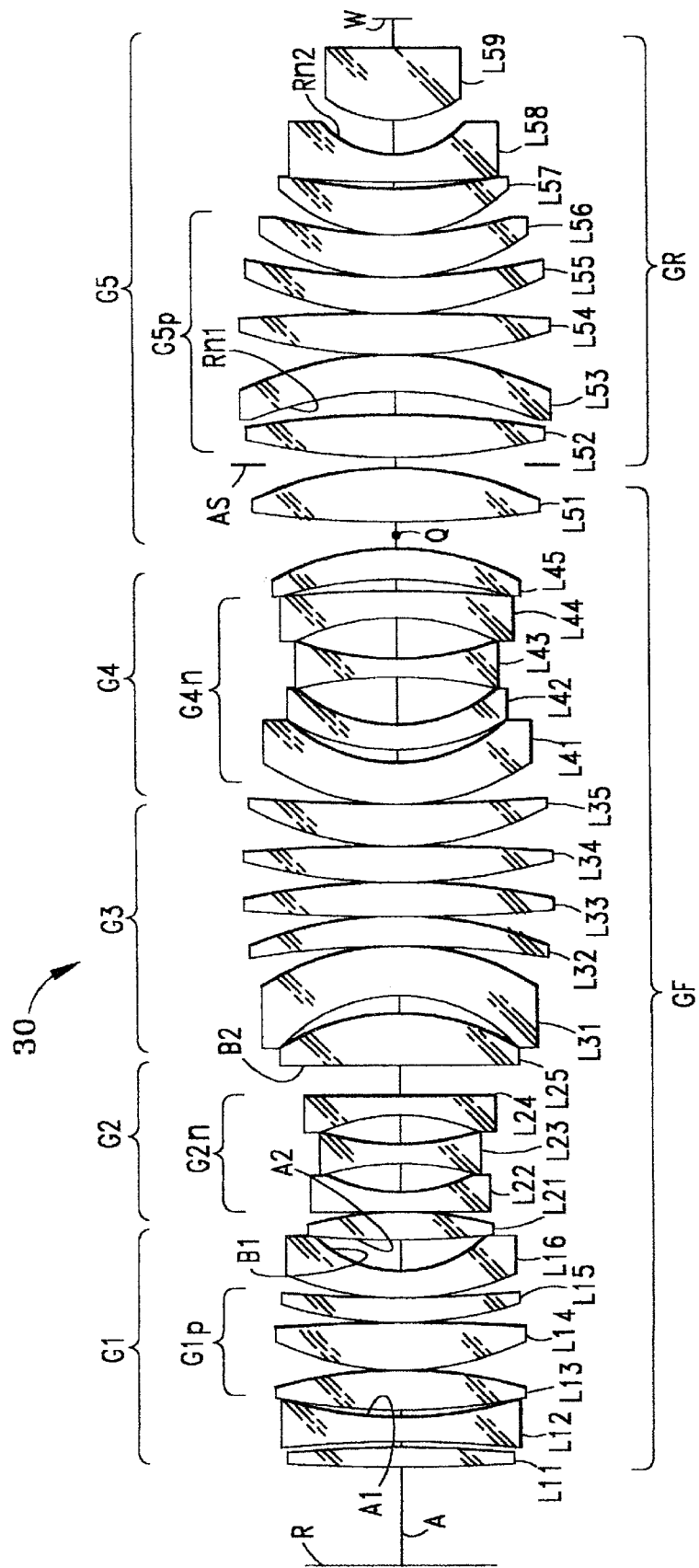
FIG. 4 is an optical diagram of the projection optical system of Working Example 2 of the present invention.
Figure 5D:
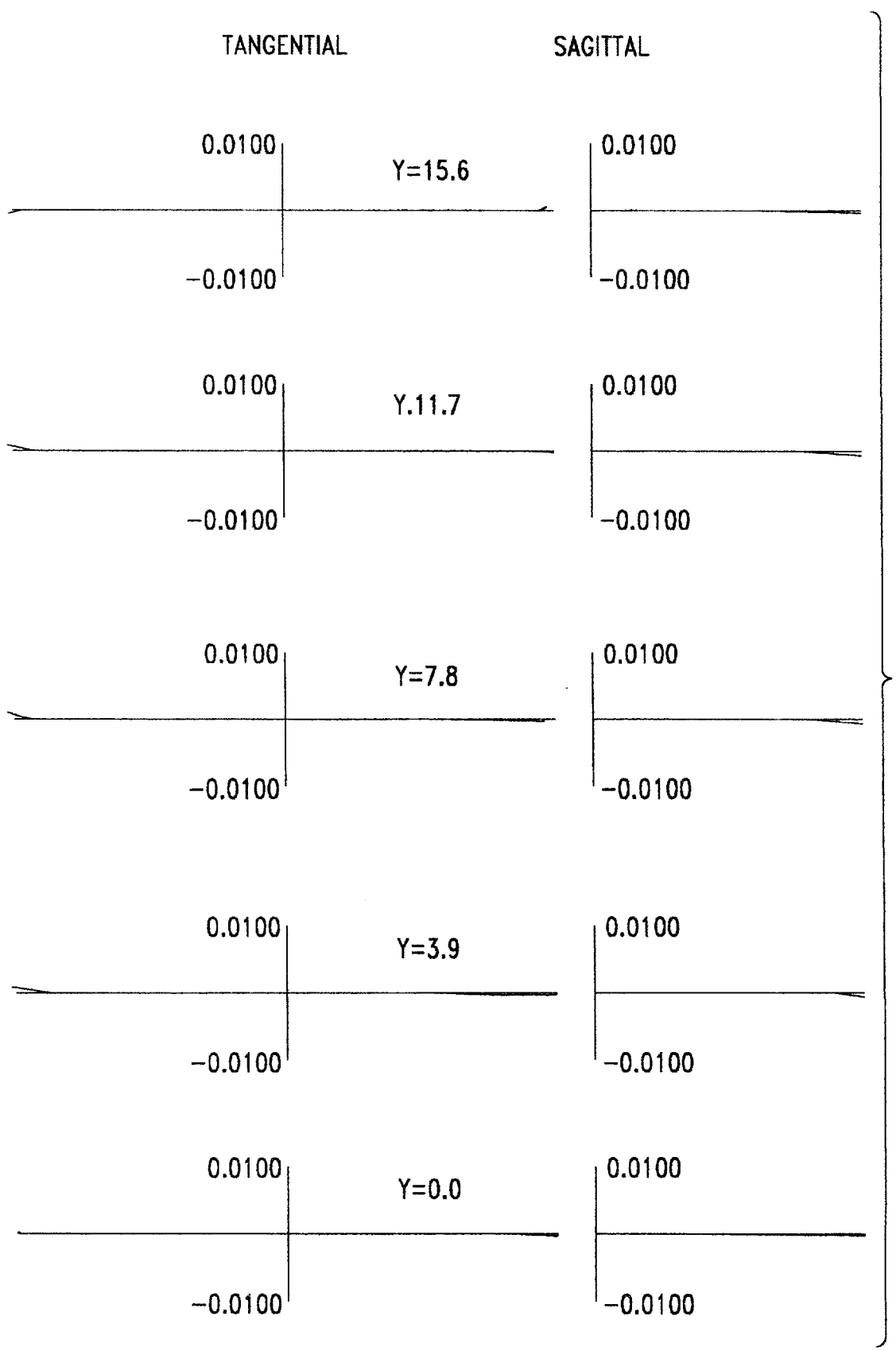

With reference now to FIG. 4, a second preferred embodiment of a projection optical system according to the present invention is a dioptric projection optical system 30 that forms an image of a pattern (not shown) on object R onto a workpiece (wafer) W disposed along an optical axis A.

System 30 includes, objectwise to imagewise, the same basic configuration of lens groups as those of projection optical system 20 of FIG. 2. In addition, system 30 comprises, from objectwise to imagewise, a first lens group G1 having a subgroup G1p having positive refractive power and surrounded on either side by a negative lens, a second lens group G2 comprises a subgroup G2n having negative refractive power and surrounded on either side by a positive lens, a third lens group G3 includes at least one negative lens, fourth lens group G4 includes a subgroup G4n which comprises at least three negative lenses, and having negative refractive power, and a fifth lens group G5 includes a subgroup G5p that comprises at least four positive lenses, and that includes at least two negative lenses overall. Lens group G5 also includes an aperture stop AS for determining the NA. System 30 further includes a paraxial pupil position Q along optical axis A between fourth lens group G4 and fifth lens group G5, wherein an imagewise to objectwise paraxial principal ray PPR, FIG. 9, which is parallel to the optical axis incidents system 30 intersects the optical axis.

In another preferred embodiment, the projection optical system 30 comprises lens group GF, rear lens group GR, and aperture stop AS positioned between the front lens group GF and the rear lens group GR. The lens group G1–G4 and lens L51 in the lens group G5 constitute the front lens group GF. The lenses L52–L59 in the lens group G5 constitute the rear lens group.

Figure 6:
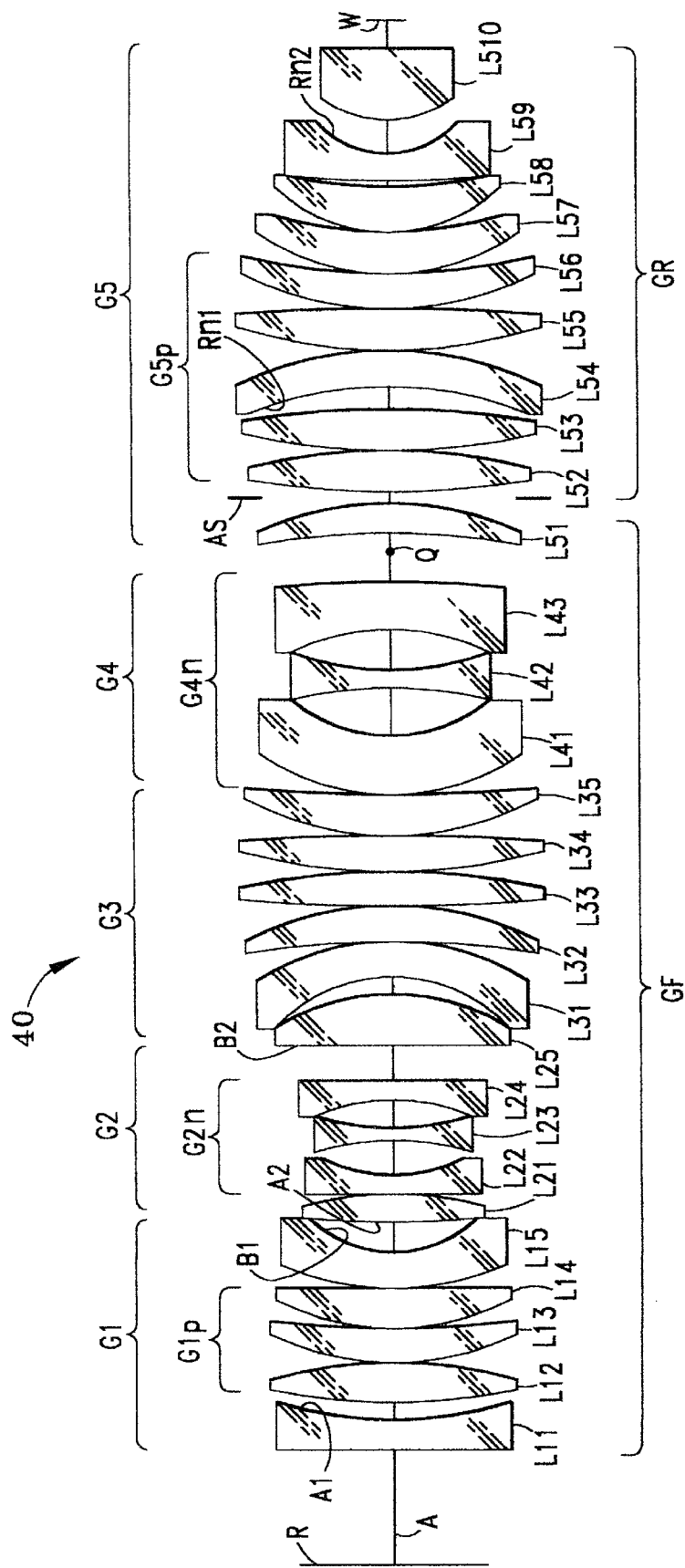
FIG. 6 is an optical diagram of the projection optical system of Working Example 3 of the present invention.
Figure 7D:
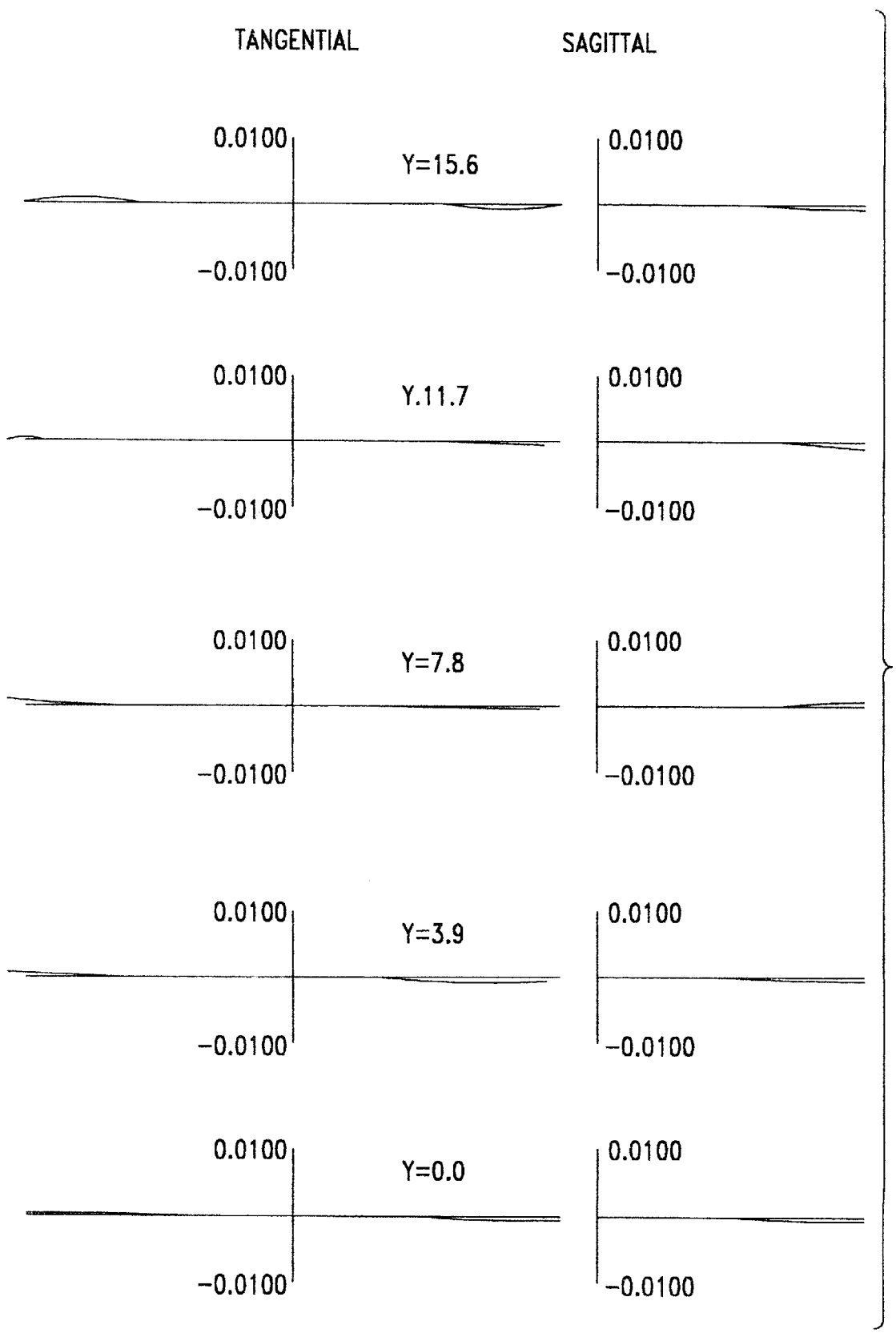

With reference now to FIG. 6, a third preferred embodiment of a projection optical system according to the present invention is a dioptic projection optical system 40 that forms an image of a pattern (not shown) on object (reticle) R onto a workpiece (wafer) W disposed along an optical axis A.

System 40 includes, objectwise to imagewise, the same basic configuration of lens groups as those of projection optical system 20 of FIG. 2, and projection optical system 30 of FIG. 4. In addition, system 40 comprises, from objectwise to imagewise, a first lens group G1 of positive refractive power having a subgroup G1p with positive refractive power and surrounded on either side by a negative lens, a second lens group G2 of negative refractive power comprises a subgroup G2n of negative refractive power and surrounded on either side by a positive lens, a third lens group G3 of positive refractive power which includes at least one negative lens, a fourth lens group G4 of negative refractive power which includes a subgroup G4n comprising at least three negative lenses, and a fifth lens group G5 of positive refractive power which includes a subgroup G5p comprising at least four positive lenses and that includes at least two negative lenses. The lens group G5 also includes an aperture stop AS for determining the NA. The system 40 further includes a paraxial pupil position Q along optical axis A between fourth lens G4 and fifth lens group G5, wherein an imagewise to objectwise paraxial principal ray, which is parallel to the optical axis, intersects the optical axis.

In another preferred embodiment, the projection optical system 40 comprises front lens group GF, rear lens group GR, and aperture stop AS positioned between the front lens group GF and the rear lens group GR. The lens group G1–G4 and lens L51 in the lens group G5 constitute the from lens group GF. The lenses L52–L510 in the lens group G5 constitute the rear lens group GR.

In a preferred embodiment of the present invention, system 30 or 40 satisfies one or more conditions of the design conditions (1)–(6), as set forth and explained above in connection with system 20 of FIG. 2.

In another preferred embodiment of the present invention, system 30 (20 or 40) preferably satisfies the design condition $$1.2 < H1max/H1min < 1.8 \quad (7)$$

wherein H1max is the maximum value and H1min is the minimum value of the distances between optical axis A and the points on the most imagewise surfaces A1 and B1 of the two negative lenses surrounding subgroup G1p (i.e., lenses L12 and L16, respectively; see FIG. 4) wherein an imagewise to objectwise ray parallel to the optical axis incident system 30 from the outermost periphery of the exposure field intersects.

As discussed above, first lens group G1 serves to correct distortion. In particular, it principally generates positive distortion, and corrects high-order distortion with the two negative lenses therein (i.e., lenses L12 and L16; see FIG. 4) having different ray incident heights. Therefore, if H1max/H1min in condition (7) exceeds the upper limit or falls below the lower limit, the balance of high-order distortions between the surfaces A1 and B1 of the two negative lenses L12 and L16 (i.e., the negative lenses surrounding the subgroup G1p), respectively, is disturbed to the point of being unacceptable.

In another preferred embodiment of the present invention, it is preferable that system 30 (20 or 40) also satisfy the design condition $$1.5 < H2max/H2min < 1.75 \quad (8)$$

wherein H2max is the maximum value and H2min is the minimum value of the distances between optical axis A and the points on each surface A2 and D2 of the two positive lenses surrounding subgroup G2n (i.e., lenses L21 and L25, respectively; see FIG. 4) wherein imagewise to objectwise ray parallel to the optical axis incident system 30 from the outermost periphery of the exposure field intersects.

Second lens group G2 serves to correct the field curvature of the image plane, as discussed above, by generating positive field curvature, and corrects high-order field curvature by virtue of the two positive lenses therein having different ray incident heights. Therefore, if H2max/H2min in condition (8) exceeds the upper limit or falls below the lower limit, the balance of high-order field curvatures generated by surfaces A2 and B2 of the two positive lenses L21 and L25 (positive lenses surrounded subgroup G2n), respectively, would be disturbed to the point of being unacceptable.

In another preferred embodiment of the present invention, it is preferable that, in system 30 (20 or 40), at least two of the negative lenses in fifth lens group G5 have objectwise concave surface. The concave surface in fifth lens group G5 preferably satisfies the design condition $$0.15 < -Rn1/L < 0.3 \quad (9)$$

wherein Rn1 is the radius of curvature of the concave surface.

The objectwise concave surfaces in fifth lens group G5 (see, e.g., lens L53 of projection optical system 30 of FIG. 4) serve the function of principally correcting negative spherical aberration generated from the positive lenses in the fifth lens group. Therefore, condition (9) stipulates an appropriate radius of curvature ratio of the concave surface with respect to the distance between object R and workpiece W. If −Rn1/L in condition (9) exceeds the upper limit, correction of negative spherical aberration generated by the positive lenses becomes inadequate. Conversely, if −Rn1/L in condition (9) falls below the lower limit, negative spherical aberration generated by the positive lenses becomes overcorrected, and high-order positive spherical aberration is generated.

In an additional preferred embodiment of system 30 (20 or 40) of the present invention, at least two negative lenses in fifth lens group G5 has a second concave surface facing imagewise. The second concave surface is disposed imagewise of the objectwise concave surface. It is preferable that the second concave surface satisfies the design condition:

$$0.06 < Rn2/L < 0.1 \quad (10)$$

wherein Rn2 is the radius of curvature of the second concave surface, facing toward imagewise, in lens group G5. The second imagewise concave surface in the fifth lens group serves to correct negative spherical aberration and negative distortion generated principally from the positive lenses in the fifth lens group. Condition (10) stipulates an appropriate radius of curvature ratio of the second concave surface with respect to the distance between object R and workpiece W. If Rn2/L in condition (10) exceeds the upper limit, negative spherical aberration and negative distortion generated by the positive lenses are undercorrected. Conversely, if Rn2/L in condition (10) falls below the lower limit, negative spherical aberration and negative distortion generated by the positive lenses are overcorrected.

In another preferred embodiment of system 30 (20 or 40) of the present invention, it is preferable that third lens group G3 include one negative lens (e.g., lens L31) and a plurality of positive lenses (e.g., lenses L32–L35), and that the negative lens in the third lens group be arranged objectwise of the plurality of positive lenses, to adjust the power of the telephoto system comprising third lens group G3 and second lens group G2.

With continuing reference to FIG. 4, it is preferable that system 30 (20 or 40) comprises an objectwise convex surface be arranged most objectwise in fourth lens group G4 (e.g., lens L41), and that a lens having an imagewise convex surface be arranged most imagewise in the fourth lens group (e.g., lens L45). These lenses control the generation of high-order spherical aberration and coma. Conversely, when the concave surfaces of these lenses respectively face objectwise and imagewise, high-order spherical aberration and coma generated by these lenses can no longer be corrected.

In addition, as discussed above, it is preferred that aperture stop AS be a variable aperture stop, and that it preferably be located imagewise of the paraxial pupil position Q. This minimizes the difference in vignetting in the exposure field when the NA is changed by varying the aperture stop. Consequently, since the difference in vignetting in the exposure field is minimized even if the NA is changed using variable aperture stop AS, uneven illumination and differences in imaging performance (e.g., differences in line width) in the exposure field can be controlled. Such exposure apparatus with a variable aperture stop is disclosed in, for example, U.S. Pat. No. 4,931,830.

Also, since the projection optical system according to the present invention has a large numerical aperture and can be made doubly telecentric, high resolution can be obtained. Moreover, the projection magnification does not change even if object R (e.g., a mask) or workpiece (e.g., a wafer) W warps. In addition, since a large exposure field can be obtained, a large chip pattern can be exposed at one time.

Exposure Apparatus

With reference again to FIG. 1, in a specific embodiment of exposure apparatus 10, projection optical system PL according to the present example has a variable aperture stop AS at a position imagewise (i.e., the workpiece side) of the paraxial pupil position, and is substantially doubly telecentric, as discussed above. Further, illumination optical system IS includes the following elements (not shown): a KrF excimer laser light source having an exposure wavelength of 248.4 nm, a fly's eye lens for uniformizing the distribution of the illumination intensity of the exposure light, an illumination aperture stop (e.g., σ (sigma) stop), a variable field stop (i.e., a reticle blind), and a condenser lens system, and the like. Furthermore, an ArF excimer laser light source having a wavelength of 193 nm wavelength, $F_2$ excimer laser light source having a wavelength of 157 nm, a higher harmonics generation from YAG laser light source (e.g., 266 nm), or a mercury lamp having an i-line wavelength of 365 nm and the like can also be used as the source of exposure light L. Exemplary illumination systems IS are those disclosed in, for example, U.S. Pat. Nos. 4,619,508, 4,851,978, 4,939,630, 5,237,367, 5,307,207 and 5,237,367. In exposure apparatus 10, the exposure light L from illumination optical system IS illuminates object R, which in the present example is a reticle. An image of the light source in illumination optical system IS is formed at or near the position of aperture stop AS of projection optical system PL, thereby resulting in Kohler illumination. The image of the pattern of the Kohler-illuminated reticle R is reduced by a projection magnification $\beta(|\beta|$ is ⅕ in the present example, but may also be ¼, etc.) through projection optical system PL, and exposed (transferred) onto workpiece (wafer) W.

With continuing reference to FIG. 1, a coordinate system is established, with the Z-axis taken to be parallel to optical axis A, the X axis taken to be parallel to the paper surface of FIG. 1 in a plane perpendicular to the Z axis, and the Y axis is taken to be perpendicular to the paper surface of FIG. 1. Object (reticle) stage RS positions reticle R in the X-Y plane. Workpiece (wafer) stage WS aligns the surface of workpiece (wafer) W with image plane 14, and positions wafer W in the X-Y plane. During exposure, a step-and-repeat operation is performed, wherein the pattern on reticle R is exposed and imaged onto an first exposure field on wafer W. Then, the workpiece (wafer) stage WS is moved so that a second unexposed area on the wafer resides under projection lens PL. Then, a second exposure field is exposed on this area. This step-and-repeat process is carried out until all or part of the surface of workpiece (wafer) W is exposed.

In an alternate preferred embodiment, the projection optical system of the present invention can also be applied to a projection exposure apparatus of a step-and-scan system. In a step-and-scan system, as mentioned above, the exposure apparatus synchronously scans reticle R and workpiece (wafer) W in exposing each exposure field on the workpiece (wafer). The scanning speed is determined by the projection magnification β as a speed ratio (i.e., workpiece (wafer) stage speed vs. object (reticle) stage speed). With a step-and-scan system, since very good image performance exists over a slit-shaped exposure field, a larger exposure field can be exposed on workpiece (wafer) W without increasing the size of projection optical system PL. The step-and-scan type exposure apparatus disclosed in, for example, U.S. Pat. No. 5,473,410.

WORKING EXAMPLES

Three Working Examples of the projection optical system of the present invention are set forth below in Tables 1a–b through 3a–b. In the Tables, D0 is the axial distance from object (reticle) R to the most objectwise lens surface of first lens group G1, WD is the axial distance (i.e., working distance) from the most imagewise lens surface of fifth lens group G5 to workpiece (wafer) W, β is the projection magnification (lateral magnification) of the projection optical system, NA is the image-side numerical aperture, φEX is the diameter of the exposure field at workpiece (wafer) W, L is the axial distance between reticle R and wafer W. The unit of distance and length is mm, for instance. The distance from paraxial pupil position Q to the actual aperture stop location is $d_Q$. Further, S is the surface number of the optical components arranged objectwise to imagewise from the reticle R, r is the radius of curvature of the corresponding lens surface (and is ∞ for a planar surface), d is the distance between adjacent lens surfaces, and n is the refractive index of the glass material at a wavelength of 248.4 nm, respectively. Fused silica, for example, can be used as the glass material. The exposure wavelength λ in the Working Examples is 248.4 nm.

FIGS. 3a–3d, 5a–d and 7a–d are aberration plots for spherical aberration, astigmatism, distortion, and coma (tangential and sagittal), for Working Examples 1–3 respectively. In each aberration plot, Y is the image height. In the astigmatism plots (FIGS. 3b, 5b and 7b), the broken line is the tangential image plane, and the solid line is the sagittal image plane.

Working Example 1

With reference again to FIG. 2, projection optical system 20 represents Working Example 1 of the present invention. System 20 is doubly telecentric and comprises, objectwise to imagewise, a first lens group G1 having positive refractive power, a second lens group G2 having negative refractive power, a third lens group G3 having positive refractive power, a fourth lens group G4 having negative refractive power, and a fifth lens group G5 having a positive refractive power.

With continuing reference to FIG. 2, first lens group G1 comprises, objectwise to imagewise, five lenses: a planoconcave negative lens L11 having an imagewise concave surface, a biconvex positive lens L12, a positive meniscus lens L13 having an objectwise convex surface, a planoconvex positive lens L14 having an objectwise convex surface, and a negative meniscus lens L15 having an imagewise concave surface. In first lens group G1, the three positive lenses L12, L13, L14, which are surrounded on either side by negative lenses L11 and L15, respectively, constitute a lens subgroup G1p having positive refractive power. In addition, if H1 is the distance from optical axis A to the point wherein rays incident system 30 imagewise to objectwise parallel to optical axis A from the outermost perimeter of the exposure field intersect each surface of the two negative lenses L11, L15, then distance H1 takes on the maximum value H1max at the imagewise surface A1 of lens L11, and a minimum value H1 min at the imagewise surface B1 of lens L15.

Next, second lens group G2 comprises, objectwise to imagewise, five lenses: a biconvex positive lens L21, a planoconcave negative lens L22 having an imagewise concave surface, a biconcave negative lens L23, a planoconcave negative lens L24 having an objectwise concave surface, and a planoconvex positive lens L25 having an imagewise convex surface. The three negative lenses L22, L23, L24, which are surrounded on either side by positive lenses L21 and L25 respectively, constitute a subgroup G2n having a negative refractive power. In addition, if H1 is the distance from optical axis A to the point wherein rays incident system 30 imagewise to objectwise parallel to optical axis A from the outermost periphery of the exposure field intersect each surface of the two positive lenses L21 and L25, then distance H2 takes on the maximum value H2max at objectwise surface A2 of L21, and distance H2 takes on the minimum value H2min at objectwise surface B2 of L25.

Next, third lens group G3 comprises, objectwise to imagewise, five lenses: a negative meniscus lens L31 having an imagewise convex surface, a positive meniscus lens L32 having an imagewise convex surface, a biconvex positive lens L33, biconvex positive lens L34, and a positive meniscus lens L35 having an objectwise convex surface. In other words, the negative meniscus lens L31 is disposed objectwise of the sub-group of lenses L32–L35 which comprises four positive lenses.

Next, fourth lens group G4 comprises, objectwise to imagewise, four lenses: a negative meniscus lens L41 having an objectwise convex surface, a negative meniscus lens L42 having an objectwise convex surface, a biconcave negative lens L43, and a negative meniscus lens L44 having an objectwise concave surface. In other words, within fourth lens group G4, the lens L41 having an objectwise convex surface is arranged most objectwise, and the lens L44 having an imagewise convex surface is arranged most imagewise. In the present Working Example, the four negative lenses L41 to L44 constitute a lens subgroup G4n having negative refractive power.

Lastly, fifth lens group G5 comprises, objectwise to imagewise, ten lenses: a positive meniscus lens L51 having an imagewise convex surface, biconvex positive lens L52, biconvex positive lens L53, negative meniscus lens L54 having an imagewise convex surface, a biconvex positive lens L55, positive meniscus lens L56 having an imagewise concave surface, a positive meniscus lens L57 having an imagewise concave surface, a positive meniscus lens L58 having an imagewise concave surface, a negative meniscus lens L59 having an imagewise concave surface, and a positive meniscus lens L510 having an objectwise convex surface. Accordingly, fifth lens group G5 is provided with the two negative lenses L54 and L59. The lenses from lens L52 to lens L56 constitutes a lens subgroup G5p having four positive lenses and positive refractive power. Also, variable aperture stop AS, which determines the NA of projection optical system 20, is located between lens L51 and lens L52.

Lens L54 is the most objectwise negative lens in fifth lens group G5, and the radius of curvature of its objectwise (concave) surface is Rn1. Likewise, lens 59 is the most imagewise negative lens in fifth lens group G5, the radius of its imagewise (concave) surface is Rn2. In addition, in projection optical system 20 of FIG. 2, paraxial pupil position Q, discussed above, is located between fourth lens group G4 and fifth lens group G5. Aperture stop AS is located imagewise of position Q so as to minimize the difference in vignetting over the exposure field.

In addition, projection optical system 20 of the present example can also be divided into two lens groups GF and GR, one on either side of aperture stop AS. In this case, front lens group GF comprises negative lens L11 to positive meniscus lens L51 objectwise of aperture stop AS, and rear lens group GR comprises positive lens L52 to positive meniscus lens L510 imagewise of aperture stop AS.

Tables 1a–1b, below, set forth the design values and characteristics of projection optical system 20 according to the first Working Example of present invention.

TABLE 1a

DESIGN VALUES:

DO = 95.789
WD = 18.023
$\beta$ = 1/5
0.4 $\leq$ NA $\leq$ 0.65
$\phi$EX = 31.2
L = 1250
$d_Q$ = 34.528

| S | r | d | n |
|---|---|---|---|
| 1 | ∞ | 20.000 | 1.50839 |
| 2 | 336.170 | 15.668 | 1 |
| ($H1_{max}$ @ A1) | | | |
| 3 | 563.367 | 34.000 | 1.50839 |
| 4 | −332.714 | 1.000 | 1 |
| 5 | 249.094 | 27.524 | 1.50839 |
| 6 | 1176.506 | 1.000 | 1 |
| 7 | 240.828 | 30.250 | 1.50839 |
| 8 | ∞ | 1.000 | 1 |
| 9 | 244.881 | 31.413 | 1.50839 |
| 10 | 110.226 | 25.492 | 1 |
| ($H1_{min}$ @ B1) | | | |
| 11 | 644.121 | 21.700 | 1.50839 |
| ($H2_{max}$ @ A2) | | | |
| 12 | −328.953 | 1.000 | 1 |
| 13 | ∞ | 13.650 | 1.50839 |
| 14 | 131.044 | 31.274 | 1 |
| 15 | −213.280 | 12.500 | 1.50839 |
| 16 | 218.736 | 26.00 | 1 |
| 17 | −136.472 | 14.000 | 1.50839 |
| 18 | ∞ | 31.419 | 1 |
| 19 | ∞ | 36.700 | 1.50839 |
| ($H2_{min}$ @ B2) | | | |
| 20 | −173.675 | 12.082 | 1 |
| 21 | −132.991 | 31.308 | 1.50839 |
| 22 | −192.471 | 1.000 | 1 |
| 23 | −765.118 | 26.256 | 1.50839 |
| 24 | −285.268 | 1.000 | 1 |
| 25 | 2894.323 | 26.250 | 1.50839 |
| 26 | −526.328 | 1.000 | 1 |
| 27 | 507.490 | 27.709 | 1.50839 |
| 28 | −1947.222 | 1.000 | 1 |
| 29 | 240.851 | 33.368 | 1.50839 |
| 30 | 1110.453 | 1.000 | 1 |
| 31 | 192.088 | 35.174 | 1.50839 |
| 32 | 137.138 | 9.450 | 1 |
| 33 | 173.194 | 17.600 | 1.50839 |
| 34 | 129.182 | 38.413 | 1 |
| 35 | −281.451 | 13.500 | 1.50839 |
| 36 | 235.460 | 33.518 | 1 |
| 37 | −163.802 | 34.000 | 1.50839 |
| 38 | −1790.552 | 24.038 | 1 |
| 39 | ∞ | 9.411 | |
| (Q) | | | |
| 40 | −449.437 | 22.117 | 1.50839 |
| 41 | −−234.289 | 3.000 | 1 |
| 42 | ∞ | 10.000 | 1 |
| (AS) | | | |
| 43 | 1108.176 | 29.200 | 1.50839 |
| 44 | −443.806 | 1.000 | 1 |
| 45 | 528.770 | 38.000 | 1.50839 |
| 46 | −505.654 | 18.010 | 1 |
| 47 | −257.696 | 24.750 | 1.50839 |
| (Rn1) | | | |
| 48 | −304.843 | 1.000 | 1 |
| 49 | 442.554 | 31.050 | 1.50839 |
| 50 | −3008.588 | 1.000 | 1 |
| 51 | 231.883 | 29.400 | 1.50839 |
| 52 | 520.812 | 1.000 | 1 |
| 53 | 173.241 | 29.750 | 1.50839 |
| 54 | 304.512 | 1.000 | 1 |
| 55 | 135.803 | 36.000 | 1.50839 |
| 56 | 367.207 | 4.609 | 1 |

TABLE 1a-continued

| | DESIGN VALUES: | | |
|---|---|---|---|
| 57 | 555.265 | 20.000 | 1.50839 |
| 58 | 80.149 | 24.952 | 1 |
| | (Rn2) | | |
| 59 | 91.120 | 57.685 | 1.50839 |
| 60 | 621.786 | (WD) | 1 |

As is clear from Table 1a and FIG. 2, the lenses comprising projection optical system 20 are not in contact with one another, i.e., there are no cemented lenses. Consequently, there is no degradation in imaging performance due to changes over time in the cemented surfaces and the like, even if the exposure is continued over a period of time.

Table 1b lists the design condition values corresponding to design conditions (1)–(10) of projection optical system 20 of the present invention.

TABLE 1b

DESIGN CONDITION VALUES:

(1) $f_1/L = 0.136$
(2) $-f_2/L = 0.055$
(3) $f_3/L = 0.170$
(4) $-f_4/L = 0.089$
(5) $f_5/L = 0.127$
(6) $0.046 \leq d_Q /\{L \cdot (1 - NA)\} \leq 0.079$
(7) $H1_{max}/H1_{min} = 1.49$
(8) $H2_{max}/H2_{min} = 1.43$
(9) $-Rn1/L = 0.206$
(10) $Rn2/L = 0.064$ If the maximum value of NA is 0.65, and the minimum value of the variable NA is 60% of the maximum, then the variable range of the NA due to variable aperture stop AS is $0.4 \leq NA \leq 0.65$ It can be seen from FIGS. 3a–3d that over the entire exposure field of projection optical system 20 of Working Example 1, distortion in particular is satisfactorily corrected and other aberrations are also corrected with good balance. In addition, even though projection optical system 20 is double telecentric, the maximum value of numerical aperture NA of 0.65 is large, and the effect of vignetting is small. Further, the various aberrations are satisfactorily corrected even if the NA is changed greatly.

Working Example 2

Next, projection optical system 30 according to the Working Example 2 of the present invention is set forth with reference to FIGS. 4 and 5a–d and Tables 2a–b. Projection optical system 30 has the same basic configuration of lens groups as projection optical system 20 of Working Example 1 (see FIG. 2). First lens group G1 comprises, objectwise to imagewise, six lenses: a biconvex positive lens L11, a biconcave negative lens L12, a biconvex positive lens L13, a biconvex positive lens L14, a positive meniscus lens L15 having an objectwise convex surface, and a negative meniscus lens L16 having an objectwise convex surface. Further, the three positive lenses L13, L14, L15, which are surrounded on either side by negative lenses L12 and L16, respectively, constitute a lens subgroup G1p having positive refractive power. In addition, if H1 is the distance from optical axis A to the point where the rays incident system 30 imagewise to objectwise parallel to optical axis A from the outermost perimeter of the exposure field intersect each surface of the two negative lenses L12, L16 then distance H1 takes on maximum value H1max at the imagewise surface A1 of L12, and a minimum value H1min at imagewise surface B1 of lens L16.

Next, the second lens group G2 and third lens group G3 comprise, objectwise to imagewise, similar lenses as lens group G2 and G3, respectively, of Working Example 1, above.

Next, fourth lens group G4 comprises, objectwise to imagewise, five lenses: negative meniscus lens L41 having an objectwise convex surface, a negative meniscus lens L42 having an objectwise convex surface, a biconcave negative lens L43, negative meniscus lens L44 having an objectwise, concave surface, and positive meniscus lens L45 having an objectwise concave surface. In other words, in fourth lens group G4, lens L41, whose convex surface faces objectwise is arranged most objectwise and lens L45, whose convex surface faces imagewise, is arranged most imagewise. In the present example, the four negative lenses L41 to L44 in fourth lens group G4 constitute a subgroup G4n having negative refractive power.

Next, fifth lens group G5 comprises, objectwise to imagewise, nine lenses: a biconvex positive lens L51, a biconvex positive lens L52, a negative meniscus lens L53 having an imagewise convex surface, a biconvex positive lens L54, positive meniscus lens L55 having an imagewise concave surface, a positive meniscus lens L56 having an imagewise concave surface, a positive meniscus lens L57 having an imagewise concave surface, a negative meniscus lens L58 having an imagewise concave surface, and a positive meniscus lens L59 having an objectwise convex surface. Accordingly, fifth lens group G5 is provided with two negative lenses L53 and L58. Lenses L52 to L56 constitutes a lens subgroup G5p which includes four positive lenses and has positive refractive power. A variable aperture stop AS that determines the NA of projection optical system 30 is located between lens L51 and lens L52.

Lens L53 is the most objectwise negative lens in fifth lens group G5, and the radius of curvature of its objectwise concave surface is Rn1. Likewise, lens 58 is the most imagewise negative lens in fifth lens group G5, the radius of curvature of its imagewise concave surface is Rn2. In addition, in projection optical system 30 of FIG. 4, paraxial pupil position Q, discussed above, is located between fourth lens group G4 and fifth lens group G5. Aperture stop AS is located imagewise of position Q so as to minimize the difference in vignetting over the exposure field.

In addition, as in projection optical system 20 of Working Example 1, described above, projection optical system 30 can be divided into two lens groups surrounding aperture stop AS. In this case, front lens group GF comprises lens L11 to lens L51 objectwise of aperture stop AS, and rear lens group GR comprises lens L52 to lens L59 imagewise of aperture stop AS.

Tables 2a–2b below, set forth the design values and characteristics of projection optical system 30 according to the present invention.

TABLE 2a

DESIGN VALUES:

DO = 86.551
WD = 17.504
β = 1/5
$0.4 \leq NA \leq 0.65$
φEX = 31.2
L = 1250
$d_Q$ = 45.506

TABLE 2a-continued

DESIGN VALUES:

| S | r | d | n |
|---|---|---|---|
| 1 | 2589.405 | 20.000 | 1.50839 |
| 2 | −570.803 | 4.586 | 1 |
| 3 | −448.305 | 17.500 | 1.50839 |
| 4 | 327.304 | 6.322 | 1 |
| ($H1_{max}$ @ A1) | | | |
| 5 | 484.159 | 34.264 | 1.50839 |
| 6 | −337.770 | 1.000 | 1 |
| 7 | 222.215 | 34.773 | 1.50839 |
| 8 | −2310.615 | 1.000 | 1 |
| 9 | 256.513 | 23.402 | 1.50839 |
| 10 | 1038.413 | 1.000 | 1 |
| 11 | 246.864 | 21.364 | 1.50839 |
| 12 | 108.069 | 25.409 | 1 |
| ($H1_{min}$ @ B1) | | | |
| 13 | 536.405 | 24.189 | 1.50839 |
| ($H2_{max}$ @ A2) | | | |
| 14 | −326.650 | 1.000 | 1 |
| 15 | 14.000 | 1.50839 | |
| 16 | 132.563 | 25.824 | 1 |
| 17 | −192.521 | 14.000 | 1.50839 |
| 18 | 244.830 | 23.592 | 1 |
| 19 | −137.386 | 14.000 | 1.50839 |
| 20 | ∞ | 25.658 | 1 |
| 21 | ∞ | 37.025 | 1.50839 |
| ($H2_{min}$ @ B2) | | | |
| 22 | −173.321 | 12.535 | 1 |
| 23 | −129.655 | 35.186 | 1.50839 |
| 24 | −191.719 | 1.000 | 1 |
| 25 | −717.342 | 25.908 | 1.50839 |
| 26 | −279.181 | 1.000 | 1 |
| 27 | 6187.075 | 25.692 | 1.50839 |
| 28 | −466.070 | 1.000 | 1 |
| 29 | 582.666 | 24.582 | 1.50839 |
| 30 | −1567.926 | 1.000 | 1 |
| 31 | 211.511 | 32.420 | 1.50839 |
| 32 | 727.206 | 1.000 | 1 |
| 33 | 205.926 | 34.500 | 1.50839 |
| 34 | 138.350 | 10.782 | 1 |
| 35 | 188.301 | 20.142 | 1.50839 |
| 36 | 132.729 | 36.260 | 1 |
| 37 | −225.973 | 15.000 | 1.50839 |
| 38 | 258.427 | 33.289 | 1 |
| 39 | −147.108 | 21.204 | 1.50839 |
| 40 | −2917.948 | 11.975 | 1 |
| 41 | −357.473 | 25.236 | 1.50839 |
| 42 | −223.201 | 7.038 | 1 |
| 43 | ∞ | 8.260 | 1 |
| (Q) | | | |
| 44 | 2119.485 | 37.246 | 1.50839 |
| 45 | −251.127 | 0.000 | 1 |
| 46 | ∞ | 9.042 | 1 |
| (AS) | | | |
| 47 | 473.778 | 35.983 | 1.50839 |
| 48 | −712.648 | 22.514 | 1 |
| 49 | −248.337 | 29.919 | 1.50839 |
| (Rn1) | | | |
| 50 | −308.957 | 1.000 | 1 |
| 51 | 954.824 | 30.124 | 1.50839 |
| 52 | −777.965 | 1.000 | 1 |
| 53 | 269.898 | 32.812 | 1.50839 |
| 54 | 971.838 | 1.000 | 1 |
| 55 | 184.725 | 34.605 | 1.50839 |
| 56 | 422.567 | 1.000 | 1 |
| 57 | 140.115 | 38.657 | 1.50839 |
| 58 | 385.984 | 5.754 | 1 |
| 59 | 667.269 | 26.967 | 1.50839 |
| 60 | 81.075 | 26.490 | 1 |
| (Rn2) | | | |
| 61 | 84.983 | 56.917 | 1.50839 |
| 62 | 526.743 | (WD) | 1 |

As in projection optical system 20 of Working Example 1, the lenses in projection optical system 30 are not in contact with one another, i.e., there are no cemented lenses. Consequently, there is no degradation in image forming characteristics due to changes over time in cemented surfaces and the like, even if the exposure is continued over a period of time.

Table 2b lists the design condition values corresponding to design conditions (1)–(10) of projection optical system 30 of Working Example 1 of the present invention.

TABLE 2b

DESIGN CONDITION VALUES:

(1) $f_1/L = 0.128$
(2) $-f_2/L = 0.056$
(3) $f_3/L = 0.167$
(4) $-f_4/L = 0.077$
(5) $f_5/L = 0.155$
(6) $0.061 \leq d_Q /\{L \cdot (1 - NA)\} \leq 0.104$
(7) $H1_{max}/H1_{min} = 1.46$
(8) $H2_{max}/H2_{min} = 1.45$
(9) $-Rn1/L = 0.199$
(10) $Rn2/L = 0.065$ If the maximum value of NA is 0.65, and the minimum value of the variable NA is 60% of the maximum, then the variable range of the NA due to variable aperture stop AS is $$0.4 \leq NA \leq 0.65$$

It can be seen from FIGS. 5a–5d that over the entire field of projection optical system 30 of the present example, distortion in particular is satisfactorily corrected and other aberrations are also corrected with good balance. In addition, even though projection optical system 30 is double telecentric, the maximum value of numerical aperture NA of 0.65 is large, and the effect of vignetting is small. Further, the various aberrations are satisfactorily corrected even if the NA is changed greatly.

Working Example 3

Next, projection optical system 40 according to Working Example 3 of the present invention is set forth with reference to FIGS. 6 and 7a–d, and Tables 3a–b. Projection optical system 40 has the same basic configuration of lens groups as projection optical system 20 of Working Example 1 (see FIG. 2). In addition, lens groups G1–G3 and G5 of projection optical system 40 include the same lenses as lens groups G1–G3 and G5 of projection optical system 20 of Working Example 1.

Fourth lens group G4 comprises, objectwise to imagewise, three lenses: a negative meniscus lens L41 having an objectwise convex surface, a biconcave negative lens L42, and a negative meniscus lens L43 having an objectwise concave surface. Negative lenses L41 and L43 whose convex surfaces respectively face objectwise and imagewise are arranged most objectwise and most imagewise in fourth lens group G4. The three negative lenses L41 to L43 constitute a lens subgroup G4n having negative refractive power.

Lens L54 is the most objectwise negative lens in fifth lens group G5, and the radius of curvature of its objectwise concave surface is Rn1. Likewise, lens L59 is the most imagewise negative lens in fifth lens group G5, the radius of curvature of its imagewise concave surface is Rn2. In addition, in projection optical system 40 of FIG. 6, paraxial pupil position Q, discussed above, is located between fourth lens group G4 and fifth lens group G5. Aperture stop AS is located imagewise of position Q so as to minimize the difference in vignetting over the exposure field. Also, projection lens optical system 40 can be divided into two lens groups, GF and GR, in the manner discussed above in connection with Working Example 1.

Tables 3a–3b, below, set forth the design values and characteristics of projection optical system 40 according to the present invention.

TABLE 3a

DESIGN VALUES:

DO = 87.378
WD = 17.634
$\beta = 1/5$
$0.4 \leq NA \leq 0.65$
$\phi EX = 31.2$
L = 1250
$d_Q = 35.998$

| S | r | d | n |
|---|---|---|---|
| 1 | ∞ | 20.000 | 1.50839 |
| 2 | 297.168 | 22.514 | 1 |
| ($H1_{max}$ @ A1) | | | |
| 3 | 468.891 | 34.000 | 1.50839 |
| 4 | −329.366 | 1.000 | 1 |
| 5 | 240.377 | 25.073 | 1.50839 |
| 6 | 1018.631 | 1.000 | 1 |
| 7 | 245.613 | 30.250 | 1.50839 |
| 8 | ∞ | 1.000 | 1 |
| 9 | 251.709 | 34.373 | 1.50839 |
| 10 | 109.718 | 24.966 | 1 |
| ($H1_{min}$ @ B1) | | | |
| 11 | 792.043 | 21.700 | 1.50839 |
| ($H2_{max}$ @ A2) | | | |
| 12 | −308.260 | 1.000 | 1 |
| 13 | ∞ | 13.650 | 1.50839 |
| 14 | 132.616 | 32.239 | 1 |
| 15 | −204.586 | 12.500 | 1.50839 |
| 16 | 259.594 | 26.000 | 1 |
| 17 | −133.001 | 14.000 | 1.50839 |
| 18 | ∞ | 31.605 | 1 |
| 19 | ∞ | 36.700 | 1 |
| ($H2_{min}$ @ B2) | | | |
| 20 | −174.494 | 18.146 | 1 |
| 21 | −129.291 | 31.787 | 1.50839 |
| 22 | −190.841 | 1.000 | 1 |
| 23 | −756.460 | 26.267 | 1.50839 |
| 24 | −285.956 | 1.000 | 1 |
| 25 | 2310.552 | 26.250 | 1.50839 |
| 26 | −501.667 | 1.000 | 1 |
| 27 | 510.538 | 27.247 | 1.50839 |
| 28 | −2140.619 | 1.000 | 1 |
| 29 | 241.585 | 30.631 | 1.50839 |
| 30 | 1316.254 | 1.000 | 1 |
| 31 | 206.671 | 47.147 | 1.50839 |
| 32 | 121.654 | 45.419 | 1 |
| 33 | −294.323 | 13.500 | 1.50839 |
| 34 | 215.887 | 36.118 | 1 |
| 35 | −162.462 | 34.000 | 1.50839 |
| 36 | −2642.160 | 26.015 | 1 |
| 37 | ∞ | 9.500 | 1 |
| (Q) | | | |
| 38 | −438.750 | 23.167 | 1.50839 |
| 39 | −237.217 | 3.331 | 1 |
| 40 | ∞ | 10.331 | 1 |
| (AS) | | | |
| 41 | 1195.213 | 29.200 | 1.50839 |
| 42 | −434.469 | 1.000 | 1 |
| 43 | 518.677 | 38.000 | 1.50839 |
| 44 | −498.817 | 18.651 | 1 |
| 45 | −262.843 | 24.750 | 1.50839 |
| (Rn1) | | | |
| 46 | −308.970 | 1.000 | 1 |
| 47 | 455.228 | 31.050 | 1.50839 |
| 48 | −2826.716 | 1.000 | 1 |
| 49 | 226.985 | 27.700 | 1.50839 |
| 50 | 471.547 | 1.000 | 1 |
| 51 | 163.460 | 29.750 | 1.50839 |

TABLE 3a-continued

DESIGN VALUES:

| 52 | 278.176 | 1.000 | 1 |
|---|---|---|---|
| 53 | 134.769 | 36.000 | 1.50839 |
| 54 | 359.751 | 5.071 | 1 |
| 55 | 509.443 | 20.000 | 1.50839 |
| 56 | 78.035 | 25.766 | 1 |
| | (Rn2) | | |
| 57 | 89.529 | 56.625 | 1.50839 |
| 58 | 604.185 | (WD) | 1 |

As in projection optical system 20 of Working Example 1, the lenses in projection optical system 40 are not in contact with one another, i.e., there are no cemented lenses. Consequently, there is no degradation in image forming characteristics due to changes over time in cemented surfaces and the like, even if the exposure is continued over a period of time.

Table 3b lists the design condition values corresponding to design conditions (1)–(10) of projection optical system 40 of the present invention.

TABLE 3b

DESIGN CONDITION
VALUES:

(1) $f_1/L = 0.132$
(2) $-f_2/L = 0.056$
(3) $f_3/L = 0.168$
(4) $-f_4/L = 0.089$
(5) $f_5/L = 0.128$
(6) $0.048 \leq d_Q /\{L \cdot (1 - NA)\} \leq 0.082$
(7) $H1_{max}/H1_{min} = 1.49$
(8) $H2_{max}/H2_{min} = 1.47$
(9) $-Rn1/L = 0.210$
(10) $Rn2/L = 0.062$ If the maximum value of NA is 0.65, and the minimum value of the variable NA is 60% of the maximum, then the variable range of the NA due to variable aperture stop AS is $0.4 \leq NA \leq 0.65$ It can be seen from FIGS. 7a–7d that over the entire field of projection optical system 40, distortion in particular is satisfactorily corrected and other aberrations are also corrected with good balance. In addition, even though projection optical system 40 is doubly telecentric, the maximum value of numerical aperture NA of 0.65 is large, and the effect of vignetting is small. Further, the various aberrations are satisfactorily corrected even if the NA is changed greatly.

In the Working Examples set forth above, a wavelength of 248.4 nm is used. However, the present invention is not so limited, and extreme ultraviolet light like an excimer laser based on ArF (193 nm wavelength), $F_2$ (157 nm wavelength) and the like, the g-line (435.8 nm wavelength) or the i-line (365.0 nm wavelength) of a mercury lamp and the like, and, light in the ultraviolet region outside thereof can be used. In addition, fused silica or Calcium Fluorite ($CaF_2$) and the like can be used as the glass material.

Exposure Method

Figure 8:
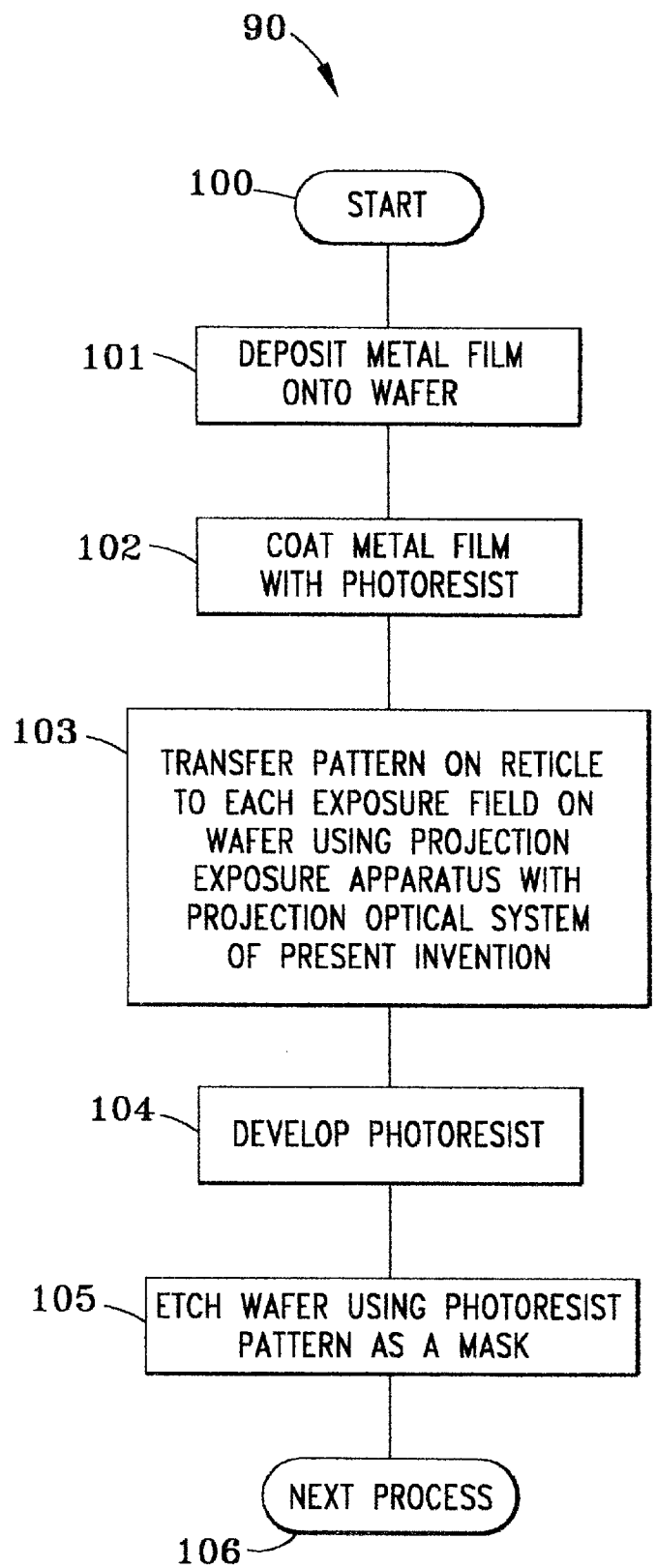
FIG. 8 is a flowchart of a preferred method of patterning a wafer with the exposure apparatus and projection optical system of the present invention.

With reference now to FIG. 8, a preferred exposure method is set forth in flow chart 90, wherein a predetermined circuit pattern on a reticle is formed on a wafer using the projection optical system of the present invention as discussed above and as set forth in the Working Examples.

The method begins with the "start" step of step 100. Then, in step 101, a metal film is vapor deposited onto the surface of one of a group ("lot") of wafers. Next, in step 102, photoresist is coated on the metal film on the wafer. Subsequently, in step 103, using the projection exposure apparatus 10 of FIG. 1, which is provided with a projection optical system PL, such as projection optical system 20 of Working Example 1 (see FIG. 2), the image of the pattern on reticle R is successively exposed and transferred via projection lens PL to each exposure field on the wafer. Subsequently, in step 104, the photoresist on the wafer is developed. Next, in step 105, a circuit pattern corresponding to the pattern on reticle R is formed in each field on each wafer by etching the wafer. In the etching process, the resist pattern serves as a mask. Next, in step 106, the next process in the method for fabricating a device is carried out, such as by further forming an upper layer circuit pattern, and the like. Subsequently, a device, such as a semiconductor integrated circuit, is manufactured.

Since the projection optical system PL of the present invention is doubly telecentric and the numerical aperture NA can be made large, a high-definition microscopic circuit pattern can be formed at a high level of resolution on each wafer, even if there is warping in each wafer W or warping in reticle R. In addition, since the exposure field of projection optical system PL is large, large devices can be manufactured with high throughput.

The first preferred embodiment of the projection optical system of the present invention has many advantages. If condition (1) is satisfied, the effect of vignetting does not increase very much even if the NA is changed, and it can be made bilaterally telecentric. In addition, if conditions (2) to (6) are further satisfied, spherical aberration and coma can be controlled, distortion in particular can be satisfactorily corrected, and lengthening of the projection optical system can be prevented.

The second preferred embodiment of the projection optical system of the present invention has many advantages as well. If conditions (1) to (6) are satisfied, the system can be made doubly telecentric while ensuring a large numerical aperture and large projection area, and various aberrations, particularly distortion, can be very satisfactorily corrected. Also, if condition (7) is satisfied, high-order distortion is satisfactorily corrected. If condition (8) is satisfied, high-order field curvature is satisfactorily corrected. If condition (9) is satisfied, then negative spherical aberration is satisfactorily corrected. If condition (10) is satisfied, negative spherical aberration and negative distortion are satisfactorily corrected.

As discussed above, the aperture stop in the preferred embodiments of the projection optical system of the present invention is a variable aperture stop. When the position of the aperture stop is arranged imagewise of paraxial pupil position Q, the difference in vignetting in the projection area on the second object is minimized when the NA is changed. Also, the projection optical systems can be made doubly telecentric while ensuring a large exposure field. Moreover, the various aberrations can be satisfactorily corrected, even if the NA is changed.

In addition, since the projection optical system of the present invention is doubly telecentric and has a large numerical aperture, the exposure apparatus has the advantage that the mask pattern image can be transferred onto a substrate at a high level of resolution, even if the mask or substrate is warped. Also, since the field area of the projection optical system of the present invention is large, an extremely microscopic circuit pattern can be formed in a large exposure field on the substrate.

While the present invention has been described in connection with preferred embodiments and Working Examples, it will be understood that it is not limited to those embodiments and Working Examples. On the contrary, it is intended to cover all alternatives, modifications, and equivalents as may be included within the spirit and scope of the invention as defined in the appended claims.

What is claimed is:

1. A dioptric projection optical system that forms an image of a pattern of an object onto a workpiece over an exposure field, said system comprising along an optical axis:

a) a variable size aperture stop, disposed at a location along the optical axis, for determining an image-side numerical aperture NA;

b) a front lens group comprising a plurality of lenses and positioned between the object and said aperture stop;

c) a rear lens group comprising a plurality of lens elements and positioned between said aperture stop and the workpiece; and d) wherein said system satisfies the condition:

$$0.005 < d_Q / \{L \times (1-NA)\} < 0.2 \tag{1}$$

wherein L is the distance along the optical axis from the object to the image, $d_Q$ is the distance along the optical axis from said aperture stop location to a position Q where a paraxial principal ray intersects the optical axis, wherein said paraxial principal ray corresponds to a ray from the workpiece side impinging upon said projection optical system parallel to the optical axis.

2. A projection optical system according to claim 1, wherein said aperture stop location is imagewise of said position Q so as to minimize differences in vignetting in the exposure field on said workpiece when said image-side NA is changed by varying said aperture stop.

3. A projection optical system according to claim 2, wherein said front lens group and said rear lens group as a whole comprise, objectwise to imagewise:

a) a first lens group having positive refractive power;

b) a second lens group having negative refractive power;

c) a third lens group having positive refractive power;

d) a fourth lens group having negative refractive power; and e) a fifth lens group having positive refractive power.

4. A projection optical system according to claim 3, wherein:

a) said first lens group includes a lens subgroup G1p surrounded imagewise and objectwise by at least one negative lens;

b) said second lens group includes a lens subgroup G2n surrounded imagewise and objectwise by at least one positive lens;

c) said fourth lens group includes a lens subgroup G4n comprising at least three negative lenses;

d) said fifth lens group includes a lens subgroup G5p comprising at least four positive lenses; and e) wherein said system satisfies at least one of the conditions:

$$0.05 < f_1/L < 0.4 \tag{2}$$

$$0.025 < -f_2/L < 0.15 \tag{3}$$

$$0.08 < f_3/L < 0.35 \tag{4}$$

$$0.04 < -f_4/L < 0.16 \quad (5)$$

$$0.06 < f_5/L < 0.35 \quad (6)$$

wherein $f_1$ is the focal length of said subgroup G1p, $f_2$ is the focal length of said subgroup G2n, $f_3$ is the focal length of said third lens group, $f_4$ is the focal length of said subgroup G4n, and $f_5$ is the focal length of said subgroup G5p.

5. A dioptric projection optical system according to claim 1, wherein said dioptric projection optical system is telecentric on the workpiece side.

6. A projection optical system capable of forming an image of a pattern of an object onto a workpiece over an exposure field, said system comprising objectwise to imagewise along an optical axis:

a) a first lens group having positive refractive power and including a lens subgroup G1p surrounded imagewise by a first negative lens having surfaces and objectwise by a second negative lens having surfaces;

b) a second lens group having negative refractive power and including a lens subgroup G2n surrounded imagewise by a first positive lens having surfaces and objectwise by a second positive lens having surfaces;

c) a third lens group having positive refractive power and including at least one negative lens;

d) a fourth lens group having negative refractive power and including a lens subgroup G4n with at least three negative lenses;

e) a fifth lens group having positive refractive power and having at least two negative lenses and including a lens subgroup G5p with at least four positive lenses;

wherein said system further includes:

f) an aperture stop, located between said lenses in said fifth lens group, for determining the numerical aperture of the projection optical system; and g) a position Q where a paraxial principal ray intersects the optical axis, wherein said paraxial principal ray corresponds to a ray from the workpiece side impinging upon said projection optical system parallel to the optical axis; and h) wherein said system satisfies one or more of the conditions:

$$0.05 < f_1/L < 0.4 \quad (1)$$

$$0.025 < -f_2/L < 0.15 \quad (2)$$

$$0.08 < f_3/L < 0.35 \quad (3)$$

$$0.04 < -f_4/L < 0.16 \quad (4)$$

$$0.06 < f_5/L < 0.35 \quad (5)$$

$$0.005 < d_Q/\{L \times (1-NA)\} < 0.2 \quad (6)$$

wherein L is the distance along the optical axis from the object to the workpiece, $f_1$ is the focal length of said subgroup G1p, $f_2$ is the focal length of said subgroup G2n, $f_3$ is the focal length of said third lens group, $f_4$ is the focal length of said subgroup G4n, $f_5$ is the focal length of said subgroup G5p, $d_Q$ is the distance along the optical axis from said position Q to said aperture stop location, and NA is said numerical aperture, on the image-side, of the projection optical system.

7. A projection optical system according to claim 6, satisfying the condition:

$$1.2 < H1max/H1min < 1.8 \quad (7)$$

wherein H1max is the maximum value and H1min is the minimum value of distances between the optical axis and points where an incident ray parallel to the optical axis and incident from said workpiece side from an outermost perimeter of the exposure field intersects said respective surfaces of said first and second negative lenses that surround said subgroup G1p.

8. A projection optical system according to claim 7, satisfying the condition:

$$1.15 < H2max/H2min < 1.75 \quad (8)$$

wherein H2max is the maximum value and H2min is the minimum value of distances between the optical axis and points where an incident ray parallel to the optical axis and incident from said workpiece side from an outermost perimeter of the exposure field intersects said respective surfaces of said first and second positive lenses that surround said subgroup G2n.

9. A projection optical system according to claim 8, wherein at least two of said negative lenses in said fifth lens group have an objectwise concave surface, and satisfy the condition:

$$0.15 < -Rn1/L < 0.3 \quad (9)$$

wherein Rn1 is the radius of curvature of said concave surface.

10. A projection optical system according to claim 9, wherein at least two of said negative lenses in said fifth lens group have an imagewise concave surface and satisfy the condition:

$$0.06 < Rn2/L < 0.1 \quad (10)$$

wherein Rn2 is the radius of curvature of said imagewise concave surface.

11. A projection optical system according to claim 7, wherein at least two of said negative lenses in said fifth tens group have an objectwise concave surface, and satisfy the condition:

$$0.15 < -Rn1/L < 0.3 \quad (9)$$

wherein Rn1 is the radius of curvature of said concave surface.

12. A projection optical system according to claim 11, wherein at least two of said negative lenses in said fifth lens group have an imagewise concave surface and satisfy the condition:

$$0.06 < Rn2/L < 0.1 \quad (10)$$

wherein Rn2 is the radius of curvature of said imagewise concave surface.

13. A projection optical system according to claim 6, wherein at least two of said negative lenses in said fifth lens group have an objectwise concave surface, and satisfy the condition:

$$0.15 < -Rn1/L < 0.3 \quad (9)$$

wherein Rn1 is the radius of curvature of said concave surface.

14. A projection optical system according to claim 13, wherein at least two of said negative lenses in said fifth lens group have an imagewise concave surface and satisfy the condition:

$$0.06 < Rn2/L < 0.1 \quad (10)$$

wherein Rn2 is the radius of curvature of said imagewise concave surface.

15. A projection optical system according to claim 6, wherein:
   a) said third lens group includes one negative lens and a plurality of positive lenses; and
   b) said negative lens in said third lens group is arranged objectwise of said plurality of positive lenses in said third lens group.

16. A projection optical system according to claim 6, wherein a lens having an objectwise convex surface is arranged most objectwise in said fourth lens group, and a lens having an imagewise convex surface is arranged most imagewise in said fourth lens group.

17. A projection optical system according to claim 6, wherein said aperture stop is variable in size and the position of said aperture stop is arranged imagewise of said position Q so as to minimize differences in vignetting in the exposure field on said workpiece when said image-side numerical aperture is changed by varying said aperture stop.

18. A projection optical system according to claim 6, wherein said position Q is located between said fourth lens group and said fifth lens group.

19. A projection optical system according to claim 6, wherein said dioptric projection optical system is telecentric on the workpiece side.

20. An exposure apparatus that forms an image of a pattern of a mask onto a substrate over an exposure field, the exposure apparatus comprising:
   a) an illumination optical system that illuminates the mask;
   b) a dioptric projection optical system;
   c) said dioptric projection optical system comprising along an optical axis:
      i) a variable-size aperture stop disposed at a location along the optical axis, for determining an image-side numerical aperture NA;
      ii) a front lens group comprising a plurality of lens elements and positioned between the mask and said aperture stop;
      iii) a rear lens group comprising a plurality of lens elements and positioned between said aperture stop and the substrate;
      iv) wherein said system satisfies the condition:

$$0.005 < d_Q/\{L \times (1-NA)\} < 0.2$$

v) L is the distance along the optical axis from the mask to the substrate, $d_Q$ is the distance along the optical axis from said aperture stop location to a position Q where a paraxial principal ray intersects the optical axis wherein said paraxial principal ray corresponds to ray from the substance side impinging upon said projection optical system parallel to the optical axis; and
   d) a stage system that positions the mask between said illumination optical system and said dioptric projection optical system and the substrate adjacent said projection optical system opposite the mask.

21. An exposure apparatus according to claim 20, wherein said dioptric projection optical system is telecentric on the substrate side.

22. A device manufacturing method comprising the steps of:
   a) coating a photosensitive material onto a substrate;
   b) projecting onto said substrate an image of a pattern of a mask through a dioptric projection optical system, said dioptric projection optical system comprising along an optical axis:
      i) a variable-size aperture stop disposed at a location along the optical axis, for determining an image-guide numerical aperture NA;
      ii) a front lens group comprising a plurality of lens elements and positioned between said mask and said aperture stop;
      iii) a rear lens group comprising a plurality of lens elements and positioned between said aperture stop and said substrate;
      iv) wherein said system satisfies the condition:

$$0.005 < d_Q/\{L \times (1-NA)\} < 0.2$$

wherein L is the distance along said optical axis from said mask to said image, $d_Q$ is the distance along said optical axis from said aperture stop location to a position Q where a paraxial principal ray intersects said optical axis, wherein said paraxial principal ray corresponds to a ray from said substrate side impinging upon said projection optical system parallel to the optical axis; and
      v) said aperture stop is variable in size;
   c) developing said photosensitive material on said substrate thereby forming a photoresist pattern; and
   d) forming a pattern in said substrate based on said photoresist pattern.

23. A method according to claim 22, wherein said front lens group and said rear lens group as a whole comprise, objectwise to imagewise:
   a) a first lens group having positive refractive power;
   b) a second lens group having negative refractive power;
   c) a third lens group having positive refractive power;
   d) a fourth lens group having negative refractive power; and
   e) a fifth lens group having positive refractive power.

24. A method according to claim 22, wherein said dioptric projection optical system is telecentric on the substrate side.

25. A method of manufacturing a dioptric projection optical system capable of forming an image of an object over an exposure field, the method comprising the steps of:
   a) providing an aperture stop at a location along an optical axis;
   b) arranging a plurality of lenses along said optical axis objectwise of said aperture stop;
   c) arranging a plurality of lenses along said optical axis imagewise of said aperture stop; and
   d) arranging said aperture stop location so as to satisfy the condition:

$$0.005 < d_Q/\{L \times (1-NA)\} < 0.2$$

wherein L is the distance along the optical axis from the object to the image, $d_Q$ is the axial distance from said aperture stop location to a position Q where imagewise to objectwise traveling paraxial principal rays intersect the optical axis, and NA is the image-side numerical aperture.

26. A manufacturing method according to claim 25, wherein said aperture stop is variable in size and is located imagewise of said position Q so as to minimize differences in vignetting in the exposure field when said NA is changed by varying said aperture stop.

27. A manufacturing method according to claim 25, wherein said step b) and said step c), together, include:
   i) providing a first lens group having positive refractive power;
   ii) providing a second lens group having negative refractive power;
   iii) providing a third lens group having positive refractive power;

iv) providing a fourth lens group having negative refractive power; and v) providing a fifth lens group having positive refractive power.

28. A dioptric projection optical system for forming an image of a pattern of an object onto a workpiece over an exposure field, the system comprising:

a first lens group, arranged in an optical path between the object and the image, having positive refractive power;

a second lens group, arranged in an optical path between the first lens group and the image, having negative refractive power;

a third lens group, arranged in an optical path between the second lens group and the image, having positive refractive power;

a fourth lens group, arranged in an optical path between the third lens group and the image, having negative refractive power;

a fifth lens group, arranged in an optical path between the fourth lens group and the image; and an aperture stop arranged in the fifth lens group, wherein at least two lenses of the fifth lens group are arranged in an optical path between the fourth lens group and the aperture stop, the fifth lens group has a lens, arranged adjacent to and imagewise of the aperture stop, with a concave surface facing objectwise, and said system has an imagewise maximum numerical aperture value including 0.65.

29. A dioptric projection optical system according to claim 28, wherein said aperture stop is variable in size.

30. A dioptric projection optical system according to claim 28, wherein said fifth lens group has a first converging lens, a second converging lens, and a third converging lens, said aperture stop is arranged between the first converging lens and the second converging lens, and said third converging lens is arranged adjacent to and imagewise of the first and second converging lenses.

31. A dioptric projection optical system according to claim 28, wherein said fifth lens group has a most objectwise lens, and wherein the most objectwise lens is a meniscus lens with a concave surface facing objectwise.

32. A dioptric projection optical system according to claim 28, wherein said fifth lens group has a converging lens arranged adjacent to and imagewise of the lens with the concave surface facing objectwise.

33. A dioptric projection optical system according to claim 28, wherein said second lens group has at least two negative lenses and a positive lens.

34. A dioptric projection optical system according to claim 28, wherein said fourth lens group has at least three negative lenses.

35. A dioptric projection optical system according to claim 28, wherein a most objectwise lens among lenses belonging in the dioptric projection optical system has negative power.

36. A dioptric projection optical system according to claim 28, wherein said first lens group has a lens with a concave surface facing objectwise.

37. A dioptric projection optical system according to claim 28, wherein said dioptric projection optical system is telecentric on the image side.

38. A dioptric projection optical system according to claim 37, wherein said dioptric projection optical system is telecentric on the object side.

39. A dioptric projection optical system according to claim 28, wherein said at least two lenses of said fifth lens group include a first pair of lenses, wherein said fifth lens group has a second pair of lenses, and wherein said aperture stop is arranged between said first pair of lenses and said second pair of lenses.

40. A dioptric projection optical system according to claim 39, wherein said dioptric projection optical system is telecentric on the image side.

41. A dioptric projection optical system according to claim 39, wherein said first pair of lenses in the fifth lens group have negative power.

42. A dioptric projection optical system according to claim 41, wherein said first pair of lenses is arranged in an optical path between the fourth lens group and the second pair of lenses in the fifth lens group.

43. A dioptric projection optical system according to claim 39, wherein said fifth lens group has three lenses arranged between the fourth lens group and the aperture stop.

44. A dioptric projection optical system according to claim 39, further comprising a space juxtaposed with at least one of the first pair of lenses and the second pair of lenses, said space having an axial thickness and a peripheral thickness smaller than the axial thickness.

45. A dioptric projection optical system according to claim 44, wherein said dioptric projection optical system is telecentric on the image side.

46. An exposure apparatus for transferring a pattern of a mask onto a workpiece, comprising:

an illumination optical system for illuminating said mask; and a dioptric projection optical system according to claim 39, arranged between the mask and the workpiece.

47. An exposure method for transferring an image of a mask onto a workpiece, comprising the steps of:

preparing a dioptric projection optical system according to claim 39;

preparing the mask as an object of said dioptric projection optical systems; and imaging the image of the mask onto the workpiece with the dioptric projection optical system.

48. An exposure method for transferring an image of a mask onto a workpiece, comprising the steps of:

preparing a dioptric projection optical system according to claim 28;

preparing the mask as an object of said dioptric projection optical system; and imaging the image of the mask onto the workpiece with the dioptic projection optical system.

49. An exposure apparatus for transferring a pattern of a mask onto a workpiece, comprising:

an illumination optical system for illuminating said mask; and a dioptric projection optical system according to claim 28, arranged between the mask and the workpiece.

50. A dioptric projection optical system according to claim 28, wherein said at least two lenses of said fifth lens group includes a first pair of lenses, wherein said fifth lens group includes a second pair of lenses, and said aperture stop is arranged between said first pair of lenses and said second pair of lenses.

51. A dioptric projection optical system according to claim 50, wherein said lens with the concave surface is a meniscus lens.

52. A dioptric projection optical system according to claim 51, wherein said fifth lens group has a space arranged in an optical path between the object and a pupil position, said space having an axial thickness and a peripheral thickness smaller than the axial thickness.

53. A dioptric projection optical system according to claim 51, wherein said dioptric projection optical system is telecentric on the image side.

54. A dioptric projection optical system according to claim 53, wherein said dioptric projection optical system is telecentric on the object side.

55. An exposure apparatus for transferring a pattern of a mask onto a workpiece, comprising:

an illumination optical system for illuminating said mask; and a dioptric projection optical system according to claim 50, arranged between the mask and the workpiece.

56. An exposure method for transferring an image of a mask onto a workpiece, comprising the steps of:

preparing a dioptric projection optical system according to claim 50;

preparing the mask as an object of said dioptric projection optical system; and imaging the image of the mask onto the workpiece with the dioptric projection optical system.

* * * * *